(12) United States Patent
Klepser et al.

(10) Patent No.: US 9,041,576 B2
(45) Date of Patent: May 26, 2015

(54) CIRCUIT AND METHOD

(71) Applicant: Intel Mobile Communications GmbH, Neubiberg (DE)

(72) Inventors: Bernd-Ulrich Klepser, Starnberg (DE); Markus Scholz, Munich (DE); Zdravko Boos, Munich (DE); Thomas Mayer, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 50 days.

(21) Appl. No.: 13/976,649

(22) PCT Filed: Dec. 20, 2012

(86) PCT No.: PCT/EP2012/076405
§ 371 (c)(1),
(2) Date: Sep. 13, 2013

(87) PCT Pub. No.: WO2013/092876
PCT Pub. Date: Jun. 27, 2013

(65) Prior Publication Data
US 2014/0002287 A1    Jan. 2, 2014

(30) Foreign Application Priority Data

Dec. 21, 2011 (DE) .......................... 10 2011 089 422
Jul. 16, 2012 (DE) .......................... 10 2012 212 397

(51) Int. Cl.
*H03M 1/66* (2006.01)
*H03M 1/74* (2006.01)
*H04L 27/20* (2006.01)
*H04L 27/36* (2006.01)
*H03M 1/82* (2006.01)

(52) U.S. Cl.
CPC . *H03M 1/74* (2013.01); *H03M 1/82* (2013.01); *H04L 27/2003* (2013.01); *H04L 27/361* (2013.01)

(58) Field of Classification Search
CPC ... H04L 27/2003; H04L 27/361; H03M 1/82; G04F 10/005
USPC .......................................... 341/144
See application file for complete search history.

(56) References Cited

U.S. PATENT DOCUMENTS 6,100,736 A    8/2000    Wu et al.
6,392,496 B1   5/2002    Lee et al.
(Continued)

OTHER PUBLICATIONS

Final Office Action Dated Sep. 12, 2014 U.S. Appl. No. 13/976,677.
(Continued)

*Primary Examiner* — Khai M Nguyen
(74) *Attorney, Agent, or Firm* — Eschweiler & Associates, LLC

(57) ABSTRACT

Embodiments of the present invention create a circuit having a digital-to-time converter with a high-frequency input for receiving a high-frequency signal, a digital input for receiving a first digital signal, and a high-frequency output for the provision of a chronologically delayed version of the HF signal. In addition, the circuit has an oscillator arrangement for the provision of the high-frequency signal, having a phase-locked loop for adjusting a frequency of the high-frequency signal. The digital-to-time converter is designed to chronologically delay the received high-frequency signal based on the first digital signal received at its digital input.

26 Claims, 17 Drawing Sheets

(56) References Cited

U.S. PATENT DOCUMENTS

| | | | |
|---|---|---|---|
| 6,720,959 | B2 | 4/2004 | Haroun et al. |
| 7,006,024 | B2 | 2/2006 | Keaveney et al. |
| 8,339,295 | B2 | 12/2012 | Nagaraj et al. |
| 2007/0110194 | A1 | 5/2007 | de Obaldia et al. |
| 2007/0189431 | A1 | 8/2007 | Waheed et al. |
| 2007/0283316 | A1 | 12/2007 | Stengel |
| 2008/0317188 | A1 | 12/2008 | Staszewski et al. |
| 2009/0190694 | A1 | 7/2009 | Kobayashi |
| 2010/0183066 | A1 | 7/2010 | Chen et al. |
| 2010/0260242 | A1 | 10/2010 | Abe et al. |
| 2010/0323643 | A1 | 12/2010 | Ridgers |
| 2011/0064150 | A1 | 3/2011 | Uozumi et al. |
| 2011/0148490 | A1 | 6/2011 | Lee et al. |
| 2011/0156783 | A1* | 6/2011 | Pavlovic et al. ............. 327/159 |
| 2011/0267120 | A1 | 11/2011 | Ravi et al. |
| 2011/0304361 | A1 | 12/2011 | Henzler et al. |
| 2012/0268184 | A1 | 10/2012 | Baumann et al. |
| 2012/0288044 | A1* | 11/2012 | Roberts et al. ................ 375/350 |

OTHER PUBLICATIONS

Chen, P. et al: "FPGA Vernier Digital-to-Time Converter with 1.58 ps Resolution and 59.3 Minutes Operation Range" In: IEEE Transactions on Circuits and Systems I, vol. 57, Issue 6, Jun. 2010, pp. 1134-1142.

Choi, Y.-C. et al: "A fully digital polar transmitter using a digital-to-time converter for high data rate system" In: IEEE Radio-Frequency Integration Technology RFIT 2009, Jan. 2009, pp. 56-59.

Pavlovic, N. et al: "A 5.3 GHz Digital-to-Time-Converter-Based Fractional-N All-Digital PLL" In: IEEE Solid-State Circuits Conference Digest of Technical Papers (ISSCC), Feb. 2011, pp. 54-56.

Roberts, G. W. et al: "A Brief Introduction to Time-to-Digital and Digital-to-Time Converters" In: IEEE Transactions on Circuits and Systems II, vol. 57, No. 3, Mar. 2010, pp. 153-157.

International Search Report and Written Opinion of the International Searching Authority dated May 22, 2013 for International Application No. PCT/EP2012/076405. 11 Pages.

International Search Report and Written Opinion of the International Searching Authority dated Jun. 6, 2013 for International Application No. PCT/EP2012/076389. 16 Pages.

U.S. Appl. No. 13/976,677, filed Jun. 27, 2013 with USPTO.

Office Action Dated May 8, 2014 U.S. Appl. No. 13/976,677.

International Search Report and Written Opinion of the International Searching Authority dated May 22, 2013 for International Application No. PCT/EP2012/076405. 5 Pages.

International Search Report and Written Opinion of the International Searching Authority dated May 22, 2013 for International Application No. PCT/EP2012/076389. 14 Pages.

Notice of Allowance Dated Mar. 13, 2015 U.S. Appl. No. 13/976,677.

* cited by examiner

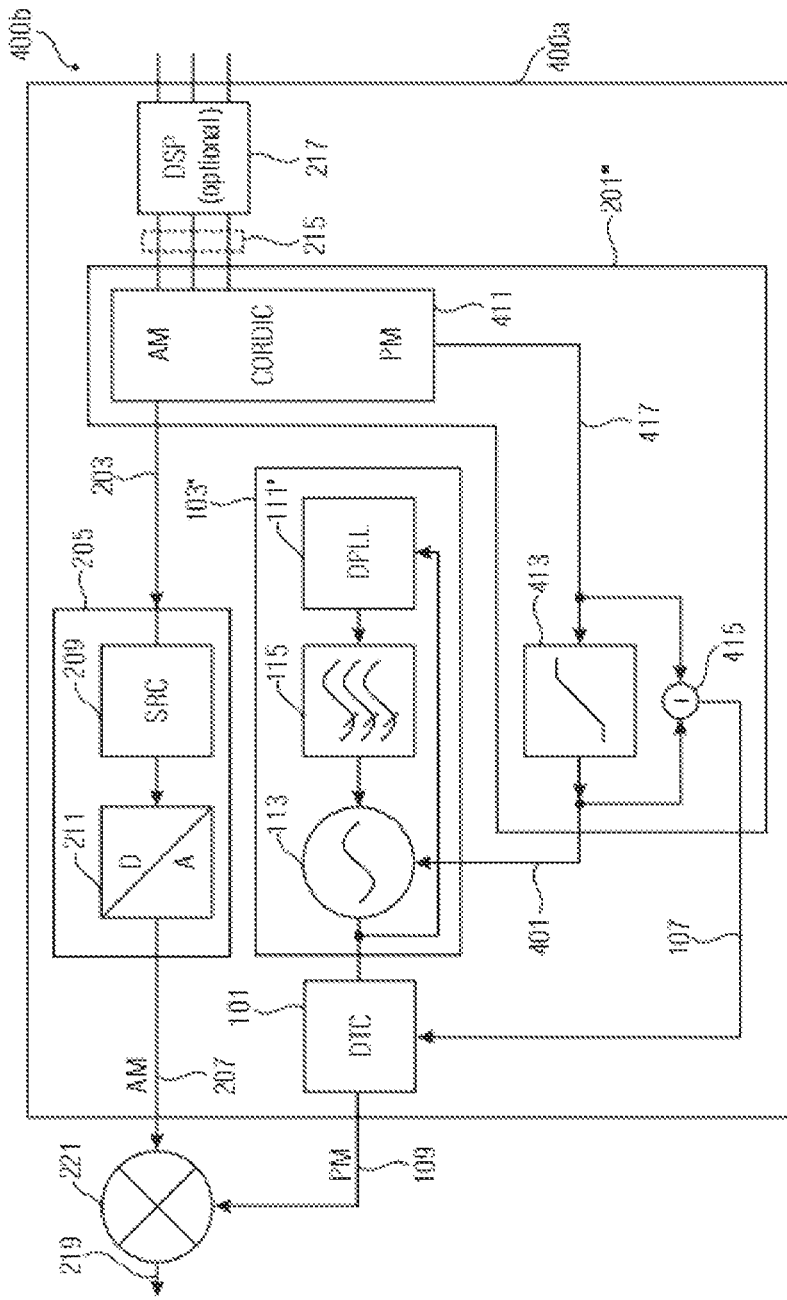

CIRCUIT AND METHOD

FIELD

Embodiments of the present invention create a circuit which can be used in a polar modulator, for example. Further embodiments of the present invention create a method which can be used for the purpose of polar modulation, for example.

BACKGROUND

The technical complexity of generating higher modulation bandwidths by means of polar modulation or RFDAC transmitter architectures is very high. This is especially so because it is necessary to generate both very small frequency steps (due to a required precision—EVM) and also large frequency steps (due to a modulation bandwidth+frequency tolerances) at the modulation point on the DCO (digitally controlled oscillator). In addition, in known systems having multiple transmitters, a separate, independent DCO must be used for each channel when DCO-modulated polar modulators are used.

SUMMARY

Embodiments of the present invention create a circuit having a digital-to-time converter with a high-frequency input for receiving a high-frequency signal, a digital input for receiving a first digital signal, and a high-frequency output for the provision of a chronologically delayed version of the high-frequency signal. In addition, the circuit has an oscillator arrangement for the provision of the high-frequency signal, having a phase-locked loop for adjusting a frequency of the high-frequency signal. The digital-to-time converter is designed to chronologically delay the high-frequency signal received at its high-frequency input, based on the first digital signal received at its digital input.

In the following, high-frequency can also be shortened as HF.

BRIEF DESCRIPTION OF THE DRAWINGS

Embodiments of the present invention are described below with reference to the attached figures, wherein:

FIG. 4e shows a further block diagram of the polar modulator in FIG. 4b, with a possible implementation of a polar coordinate provider;

DETAILED DESCRIPTION

Prior to the detailed description below of embodiments of the present invention, it is hereby noted that elements in the figures which have the same function, or the same elements, are indicated by the same reference numbers, and no redundant description is given of these elements. For this reason, descriptions of elements indicated by the same reference numbers are interchangeable.

Figure 1A:
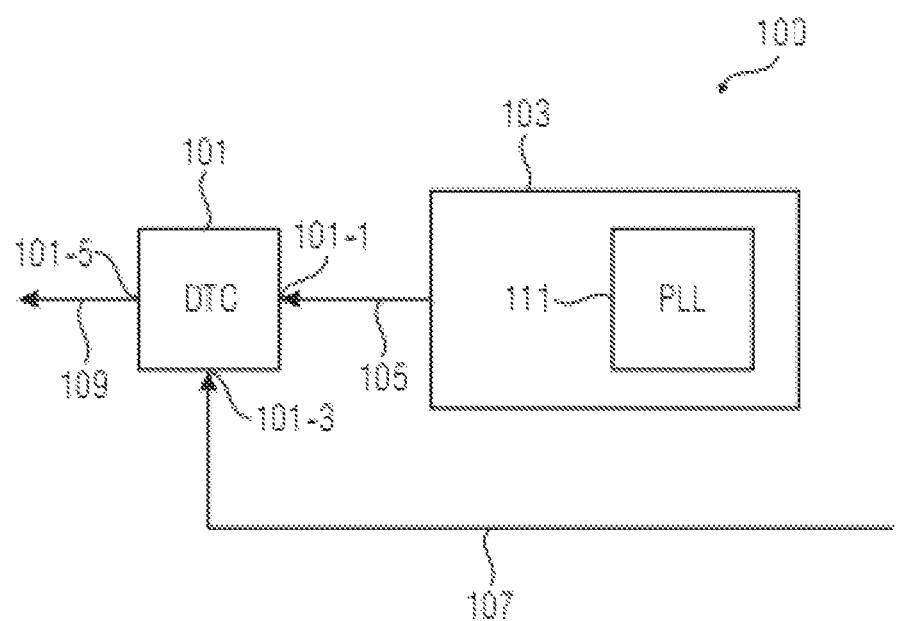
FIG. 1a shows a block diagram of a circuit according to one embodiment of the present invention.

FIG. 1a shows a circuit 100 with a digital-to-time converter 101, and an oscillator arrangement 103. A digital-to-time converter can also be termed a DTC in the following. The digital-to-time converter 101 has a high-frequency input 101-1 for receiving a high-frequency signal 105, a digital input 101-3 for receiving a digital signal, and a high-frequency output 101-5 for the provision of a chronologically delayed version 109 of the high-frequency signal 105. The chronologically delayed version 109 of the high-frequency signal 105 can also be termed a (chronologically) delayed high-frequency signal 109 in the following.

The oscillator arrangement 103 is designed to produce the high-frequency signal 105. In addition, the oscillator arrangement 103 has a phase-locked loop 111. The phase-locked loop 111 is designed to adjust a frequency of the high-frequency signal 105. A phase-locked loop can also be termed a PLL in the following.

The digital-to-time converter 101 is designed to chronologically delay the high-frequency signal 105 received at its high-frequency input 101-1, based on the first digital signal 107 received at its digital input 101-3.

Circuits according to embodiments of the present invention can preferably be high-frequency circuits; as such, the high-frequency signal 105 can have a frequency which is greater than or equal to 100 kHz, for example.

According to several embodiments, the high-frequency signal 105 can have a frequency as specified by a radio standard, for example. By way of example, the high-frequency signal 105 can have a frequency in a range from (and including) 700 MHz to (including) 12 GHz.

An idea of the embodiments of the present invention is that a phase modulation of the high-frequency signal 105 is enabled by the use of the digital-to-time converter 101, without the need to use the phase-locked loop 111 for the phase modulation. The use of the digital-to-time converter 101 for the phase modulation of the high-frequency signal 105 in place of the phase-locked loop 111 for phase modulation enables a greater modulation bandwidth, meaning it is possible to generate larger phase jumps in a simpler manner.

In order to make it possible to enable such large modulation bandwidths in known systems, the same being enabled by means of embodiments of the present invention, either DCOs (digitally controlled oscillators) with a very large number of small and large varactors are developed, or a direct modulation architecture is used. The disadvantage of many such tuning capacitors is energy consumption and an increased number of oscillator cores. In addition, there is a technical limitation of achievable modulation bandwidths. The disadvantage of the direction modulation architecture is the energy consumption thereof; for this reason, a polar modulation chain with additional chip surface is included for standards using small bandwidths.

In addition, the polar modulation architecture has the disadvantage that multiple oscillators and synthesizers must be determined for multiple transmission paths.

In contrast, in embodiments of the present invention, a phase modulation of the high-frequency signal 105 over large modulation bandwidths is enabled by the use of the digital-to-time converter 101, with minimal complexity.

The circuit 100 can also be termed a RFDAC (radio frequency digital-to-analog converter). The circuit 100 shown in FIG. 1a can be used in polar modulators, and therefore enables a polar modulation architecture. By means of the use of the circuit 100 in a polar modulator, it is possible to develop smaller, more energy-saving multi-transmitters and multi-antenna architectures.

Figure 1B:
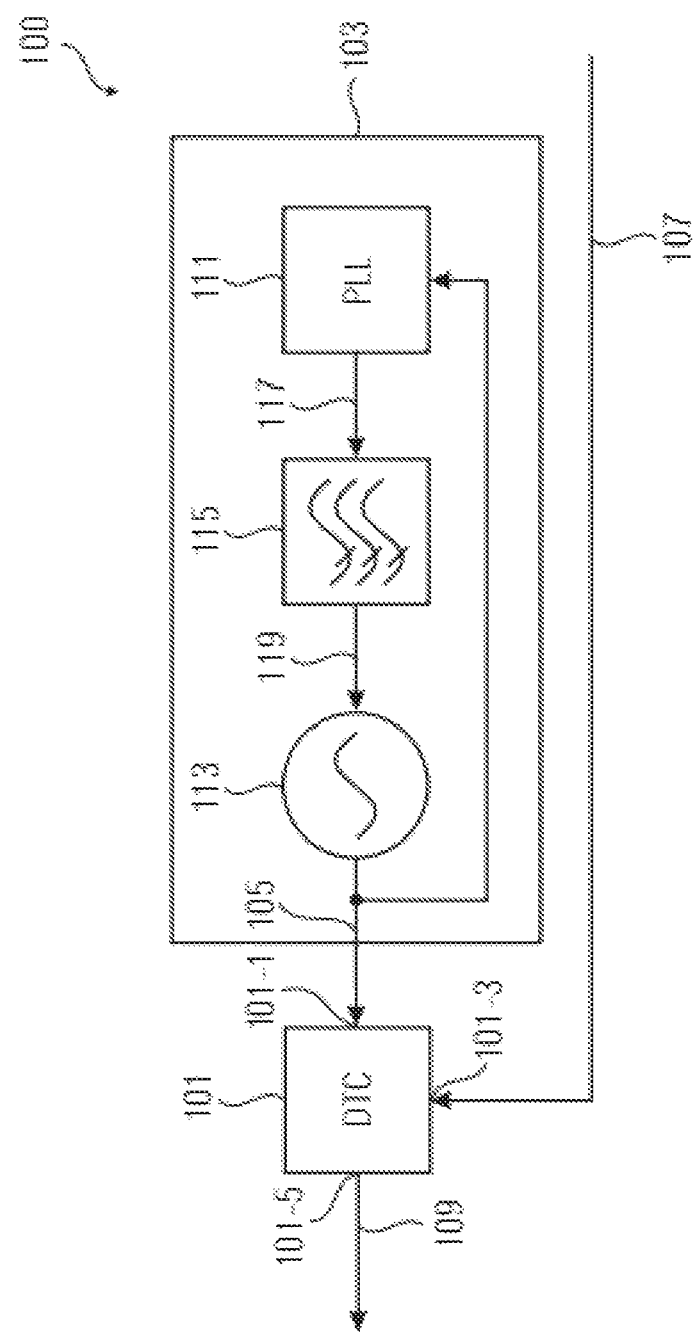
FIG. 1b shows a block diagram of a circuit according to a further embodiment of the present invention.

FIG. 1b shows a possible implementation of the oscillator arrangement 103 in the circuit 100. In the embodiment shown in FIG. 1b, the oscillator arrangement 103 has an oscillator 113 and a loop filter 115 in addition to the phase-locked loop 111. The oscillator 113 is designed to produce the high-frequency signal 105. The phase-locked loop 111 receives the high-frequency signal 105 and can compare this high-frequency signal 105 to a reference signal in order to provide the loop filter 115 with an error signal 117; based on the latter, the loop filter 115 provides the oscillator 113 with an adjustment signal 119 for the purpose of adjusting the frequency of the high-frequency signal 105.

According to several embodiments, the circuit 100 can further have an additional voltage divider between the oscillator 113 and the digital-to-time converter 101. Such a voltage divider can be designed, for example, to divide and drop the frequency of the high-frequency signal 105 before it is relayed to the digital-to-time converter 101.

According to several embodiments of the present invention, the oscillator arrangement 103 can be constructed digitally, meaning that the phase-locked loop 111 can be a digital phase-locked loop (a so-called DPLL), and the oscillator 113 can be a digitally controlled oscillator (DCO) or a numerically controlled oscillator (NCO), for example.

However, in addition, according to a further embodiment of the present invention, it is also possible that the oscillator arrangement 103 is constructed in an analog manner—for example, in such a manner that the oscillator 113 is a voltage-controlled oscillator (a so-called VCO), and the phase-locked loop 111 is an analog phase-locked loop 111.

In the following embodiments, digital implementations of the oscillator arrangements are used in each case; however, as described above, analog implementations can also be contemplated.

According to several embodiments, the oscillator arrangement 103 (such as that shown in FIG. 1b) can provide the high-frequency signal 105 independently of the digital signal 107, and therefore independently of the desired delay of the high-frequency signal 105. As described above, the circuit 100 can be used for the purpose of modulating the high-frequency signal 105 in phase, such that the delayed high-frequency signal 109 is a phase-modulated version of the high-frequency signal 105. A phase alteration and/or a phase of the delayed high-frequency signal 109 can be prespecified by the digital signal 107, and the oscillator arrangement 103 can be designed to provide the high-frequency signal 105 independently of the phase, the same being prespecified by the digital signal 107, for the delayed high-frequency signal 109.

This is shown below with reference to the embodiments shown in FIGS. 2a to 3b, which are based on the configuration wherein a PLL is used without modulation in the phase modulation (for example, a polar modulation), and the phase is modulated directly by the digital-to-time converter 101.

According to further embodiments, however, it is also possible that the oscillator arrangement 103 modulates a part of the phase of the delayed high-frequency signal 109 during the production of the high-frequency signal 105, and another part of the phase is modulated by means of the digital-to-time converter 101. Such a principle is described in detail below with reference to FIGS. 4a to 4c.

Figure 2A:
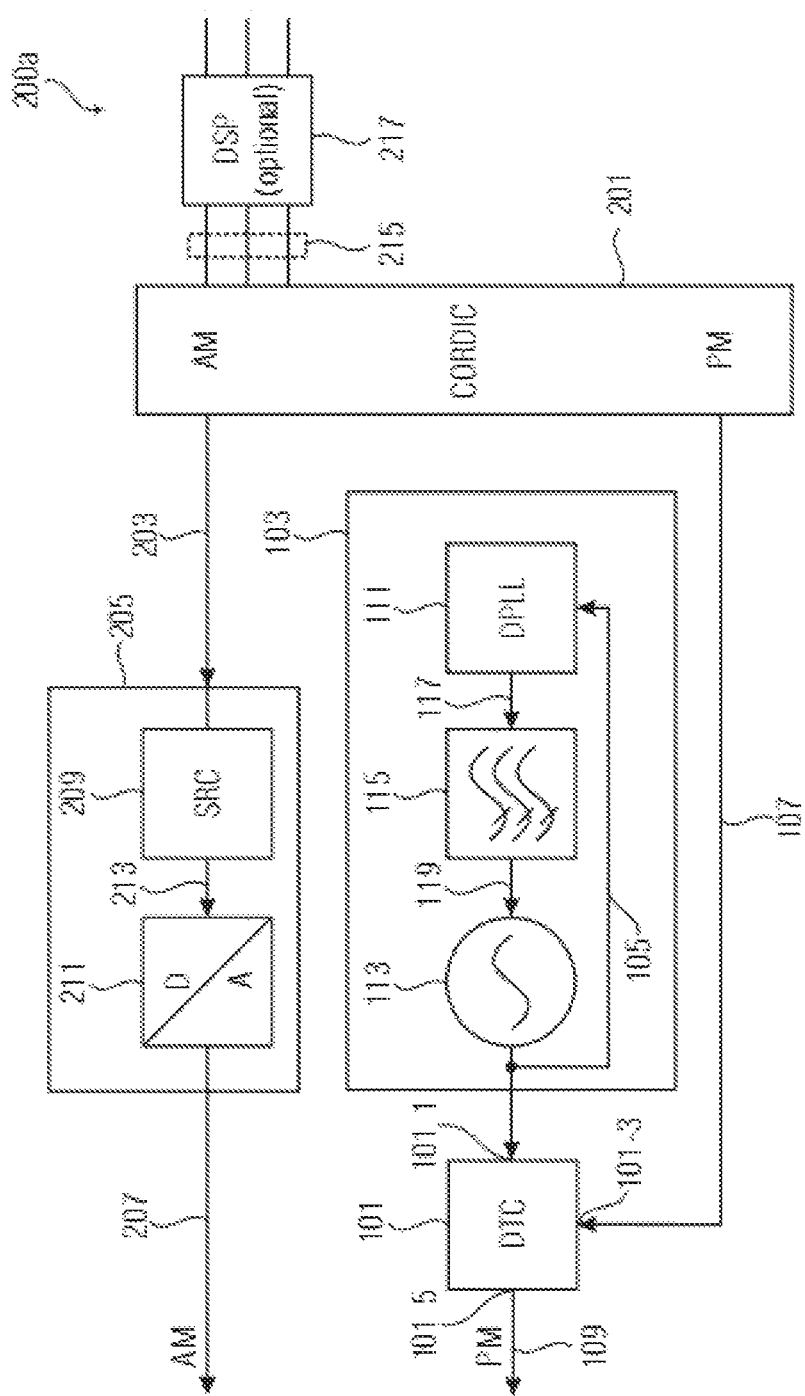
FIG. 2a shows a block diagram of a circuit according to a further embodiment of the present invention.

FIG. 2a shows a block diagram of a circuit 200a according to a further embodiment of the present invention.

The circuit 200a comprises all the components of the circuit 100 according to FIG. 1b. In other words, the circuit 200a comprises both the digital-to-time converter 101 and the oscillator arrangement 103. In addition, the circuit 200a has a polar coordinate provider 201 which is designed to provide the digital signal 107 to the digital-to-time converter 101. As described above, the digital signal 107 can determine a phase or a phase modification of the delayed HF signal 109. The digital signal 107 provided by the polar coordinate provider 201 can therefore be a phase signal which determines phase modifications of the delayed high-frequency signal 109 and which includes the digital signal 107 (or, as shown in FIG. 2a), is the same as the digital signal 107.

In other words, the digital signal 107 can represent a phase-modulated signal.

According to further embodiments, the polar coordinate provider 201 (and the polar coordinate providers described below) can also be designed such that the digital signal 107 is a superposition of one or multiple (modulated) payload data signal(s) and a signal with a prespecified (for example, over a defined time segment), constant frequency. In other words, the digital signal 107 can have a frequency offset in addition to the payload data. In this way, the configuration makes it possible, in combination with the digital-to-time converter, for the delayed HF signal 109 to have a frequency which is different from the frequency of the high-frequency signal 105. In particular, it is possible for the frequency of the delayed high-frequency signal 109 to not be a harmonic of the frequency of the high-frequency signal 105.

In other words, in such embodiments of the digital-to-time converter 101, the configuration can exploit this to generate frequencies which are not harmonics of the frequency of the high-frequency signal 105 generated by the oscillator 113.

In other words, it is possible to generate a digital-to-time converter system with rotating phase as a result of the fact that the first digital signal 107 has the superposition described above of (a) payload data signal(s) and the signal of a prespecified, constant frequency, and thereby it is also possible to generate a non-harmonic intermediate RF frequency. This can also be expanded to TX-MIMO applications, with the specific feature that it is then possible to generate two different transmission signals from a single PLL.

In addition, the polar coordinate provider 201 can be designed to provide a digital amplitude signal 203. The circuit

200a can also have a digital-to-analog converter arrangement 205 which is designed to provide an amplitude-modulated signal 207 based on the digital amplitude signal 203.

In the embodiment shown in FIG. 2a, the digital-to-analog converter arrangement 205 has a sample rate converter (SRC) 209 as well as a digital-to-analog converter 211.

The sample rate converter 209 is designed to receive the digital amplitude signal 203, carry out a sample rate conversion, and provide signal 213 resulting from that conversion to the digital-to-analog converter 211. The digital-to-analog converter 211 is designed to convert the signal 213 provided by the sample rate converter 205 from digital to analog in order to output the amplitude-modulated signal 207.

The delayed (or phase-modulated) HF signal 109 can describe a transmission signal, together with the amplitude-modulated signal 207, wherein the phase of the transmission signal is described by the delayed HF signal 109, and the amplitude or the magnitude of the transmission signal is described by the amplitude-modulated signal 207.

As such, for example, the polar coordinate provider 210 can be designed to receive this transmission signal in a digital IQ (I: in phase, Q: quadrature) representation, and to translate this transmission signal from the IQ representation into polar coordinates, wherein the amplitude or the magnitude is described by the digital amplitude signal 203, and the phase is described by the phase signal provided by the polar coordinate provider 201 (which corresponds to the digital signal 107 in the embodiment shown in FIG. 2a).

The transmission signal in the digital IQ representation 215 can be generated by an optional digital signal processor (DSP) 217, for example, which can be outside of the circuit 200a or can be a component of the circuit 200a. In addition, the polar coordinate provider 201 can be designed to execute a so-called CORDIC algorithm (coordinate rotation digital computer) in order to provide the digital signal 107 as well as the digital amplitude signal 203.

The circuit 200a shown in FIG. 2a can be used in polar modulators, for example.

Figure 2B:
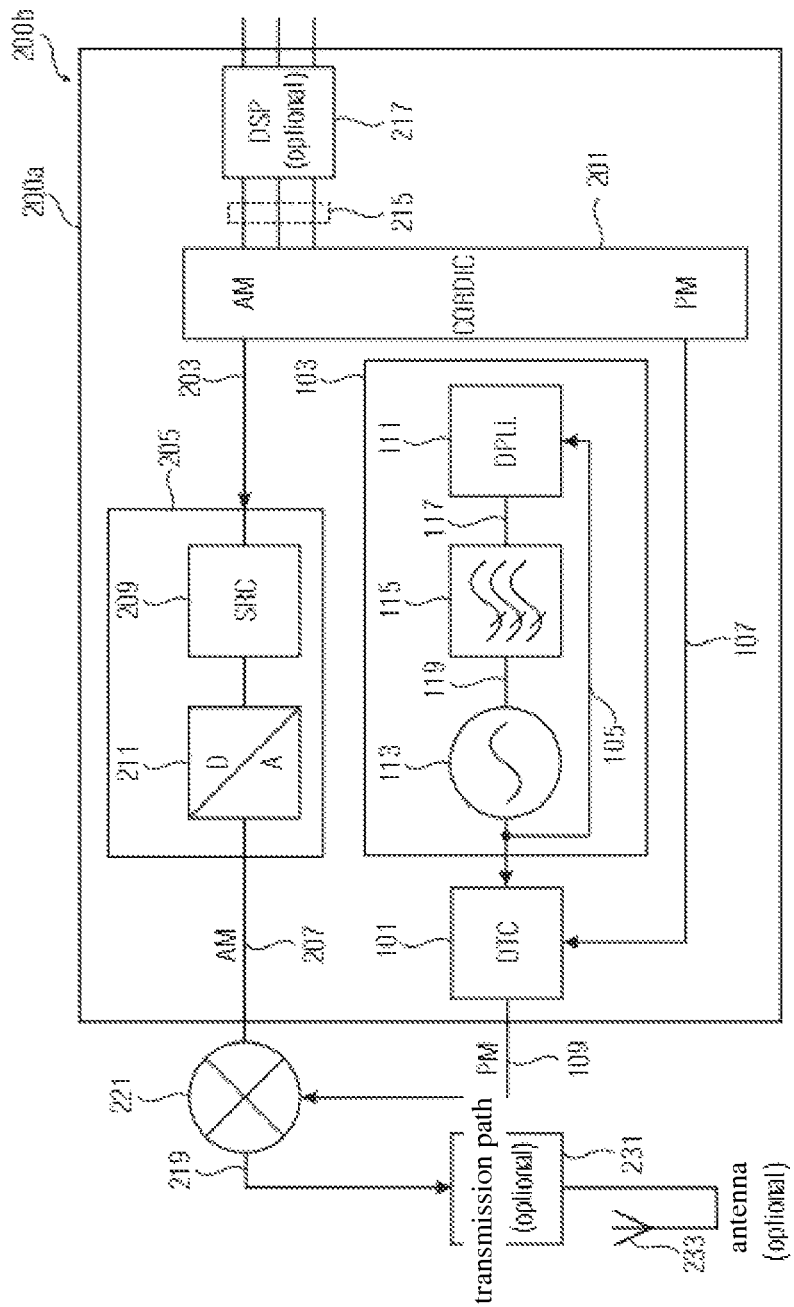
FIG. 2b shows a polar modulator according to a further embodiment of the present invention, based on the small-signal polar modulation principle.

FIG. 2b shows an additional circuit 200b and/or a polar modulator 200b which is designed to provide a phase- and amplitude-modulated transmission signal 219 on the delayed HF signal 109 and the amplitude-modulated signal 207. The polar modulator 200b also has a mixer 221, in addition to the circuit 200a, which is designed to mix the amplitude-modulated signal 207 and the delayed (and/or phase-modulated) high-frequency signal 109, in order to obtain the amplitude- and phase-modulated transmission signal 219 as a result of the mixing.

The use of the mixer 221 to combine the amplitude-modulated signal 207 with the delayed HF signal 109 can also be termed a small-signal polar architecture.

The DSP 217 can be a processor (for example, a baseband processor) or part of such a processor, for example. By way of example, the DSP 217 can be a processor of a portable mobile radio device (a handset, such as a mobile telephone or smartphone) or of a tablet computer or laptop.

In addition, an output of the mixer 221 can be coupled with an optional antenna 233 (for example, via a suitable, optional transmission path 231, for example, having an amplifier and a matching network) in order to transmit the amplitude- and phase-modulated transmission signal 219 to the antenna 233.

Figure 2C:
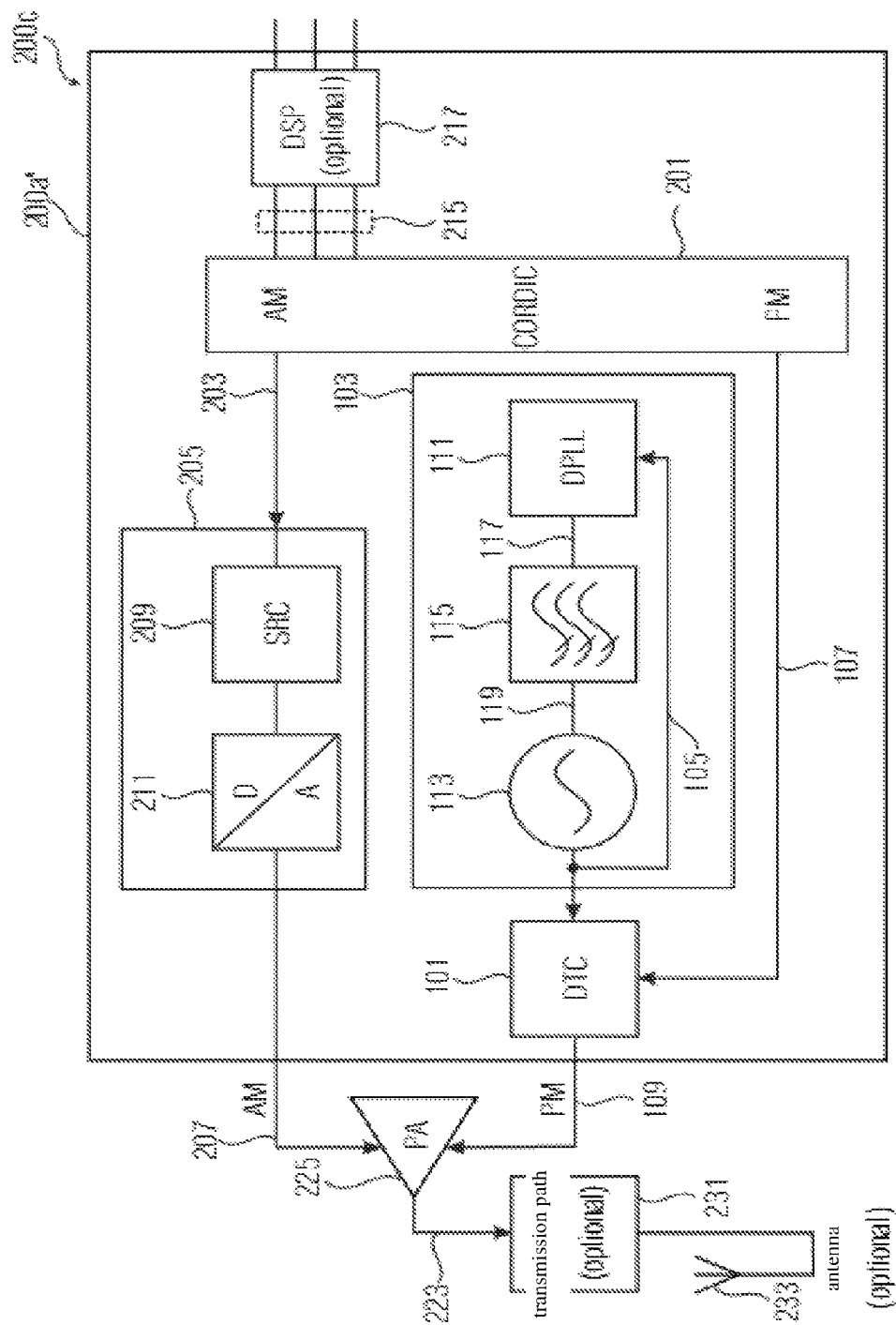
FIG. 2c shows a block diagram of a polar modulator according to a further embodiment of the present invention, based on the large-signal polar modulation principle.

According to further embodiments, the circuit 200a can also be used in so-called large signal polar architectures. This is shown in FIG. 2c in a circuit 200c and/or a polar modulator 200c which has the circuit 200a as in the polar modulator 200b and is designed to provide a transmission signal 223 based on a combination of the delayed (and/or phase-modulated) HF signal 109 and the amplitude-modulated signal 207. In contrast to the polar modulator 200b, the polar modulator 200c has no mixer 221, however, but has an amplifier (or a power amplifier, PA) 225. The amplifier 225 is designed to amplify the delayed HF signal 109 based on the amplitude-modulated signal 207, to obtain the transmission signal 223 based on the amplification. In other words, the amplifier 225 is designed to adjust an amplification of the delayed HF signal 109 based on the amplitude-modulated signal 207.

In addition, an output of the amplifier 225 can also be coupled to an optional antenna 233, as in the case of the polar modulator 200b in FIG. 2b and the polar modulator 200c (for example, via a suitable optional transmission path 231, for example, having a further amplifier and a matching network), in order to transmit the transmission signal 223 to the antenna 233.

Additional embodiments of the present invention therefore also create a device with a baseband processor, an antenna, and a circuit according to an embodiment of the present invention which is coupled to the antenna and the baseband processor.

In some applications, it can be necessary to generate and/or output multiple radio signals with the same carrier frequency, but different data. This can also be realized in a simple manner with embodiments of the present invention.

Figure 3A:
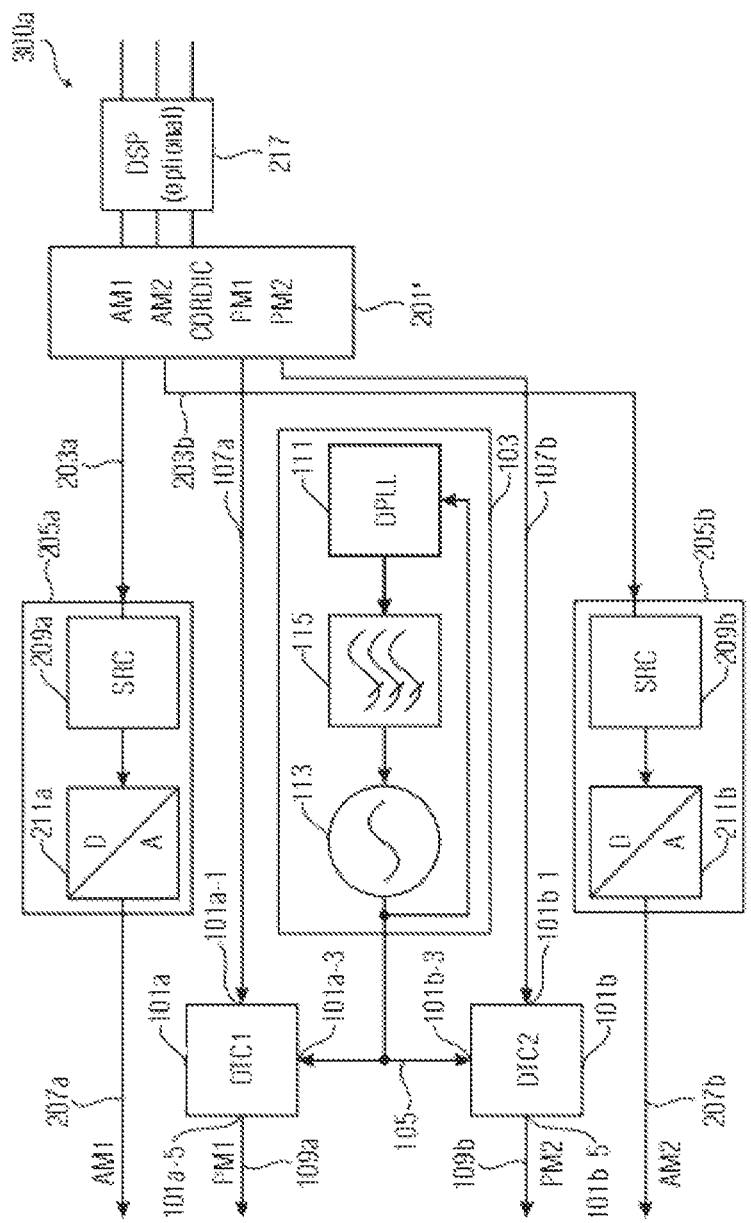
FIG. 3a shows a block diagram of a circuit according to a further embodiment of the present invention.

FIG. 3a shows a circuit 300a for this purpose, according to a further embodiment of the present invention.

The circuit 300a differs from the circuits described above in that it has a first digital-to-time converter 101a and a second digital-to-time converter 101b. The circuit 300a is therefore designed to provide a first delayed HF signal 109a and a second delayed HF signal 109b.

The first digital-to-time converter 101a has a digital input 101a-1 for receiving a first digital signal 107a, an HF input 101a-3 for receiving the HF signal 105, and an HF output for providing the first delayed HF signal 109a. The second digital-to-time converter 101b has a digital input 101b-1 for receiving a second digital signal 107b, an HF input 101b-3 for receiving the HF signal 105, and an HF output 101b-5 for providing the second delayed HF signal 109b.

In addition, the circuit 300a has a polar coordinate provider 201' which is designed to provide the first digital signal 107a to the first digital-to-time converter 101a, and to provide the second digital signal 107b to the second digital-to-time converter 101b.

In addition, the polar coordinate provider 201' is designed to provide a first digital amplitude signal 203a and a second digital amplitude signal 203b.

The circuit 300a therefore further has a first digital-to-analog converter arrangement 205a, and a second digital-to-analog converter arrangement 205b.

The first digital-to-analog converter arrangement 205a has a first digital-to-analog converter 211a, and a first sample rate converter 209a, the second digital-to-analog converter arrangement 205b has a second digital-to-analog converter 211b and a second sample rate converter 209b.

The first digital-to-analog converter arrangement 205a is designed to convert the first digital amplitude signal 203a from digital to analog, in order to obtain a first amplitude-modulated signal 207a, and the second digital-to-analog converter arrangement 205b is designed to convert the second digital amplitude signal 203b from digital to analog, in order to obtain a second amplitude-modulated signal 207b.

The first digital-to-time converter 101a is designed to chronologically delay the HF signal 105, the same provided by the oscillator arrangement 103, based on the first digital signal

107a, in order to obtain the first (chronologically) delayed HF signal 109a and/or a first (chronologically) delayed version 109a of the HF signal 105.

The second digital-to-time converter 101b is designed to chronologically delay the HF signal 105, the same provided by the oscillator arrangement 103, based on the second digital signal 107b, in order to obtain the second (chronologically) delayed HF signal 109b and/or a second (chronologically) delayed version 109b of the HF signal 105.

The oscillator arrangement 103 can therefore form a synthesizer for both the first digital-to-time converter 101a and for the second digital-to-time converter 101b. In other words, the first digital-to-time converter 101a and the second digital-to-time converter 101b receive the same carrier signal 105, which they delay (differently) according to the digital signals 107a, 107b they receive.

The delayed HF signals 109a, 109b generated by the digital-to-time converters 101a, 101b therefore have the same carrier frequency, but differ in their phase.

In one simple embodiment of the present invention utilizing two digital-to-time converters 101a, 101b, the digital-to-analog converter arrangements 205a, 205b, the polar coordinate provider 201', and the digital signal processor 217 can be left out of the configuration. By way of example, the two digital signals 107a, 107b can be provided by a circuit which is external to one of the circuits 300a.

By means of the concept shown in FIG. 3a, a beam-forming architecture and/or a MIMO (multiple input, multiple output) architecture having two transmission signals and a single synthesizer (of the oscillator arrangement 103) is enabled. By way of example, the digital signal processor 217 can be designed for this purpose to simultaneously provide IQ representations for two different transmission signals.

As such, a first transmission signal can be based on a combination of the amplitude-modulated HF signal 107a and the first delayed HF signal 109a, for example, and a second transmission signal can be based on a combination of the second amplitude-modulated signal 207b and the second delayed HF signal 109b, for example.

Figure 3B:
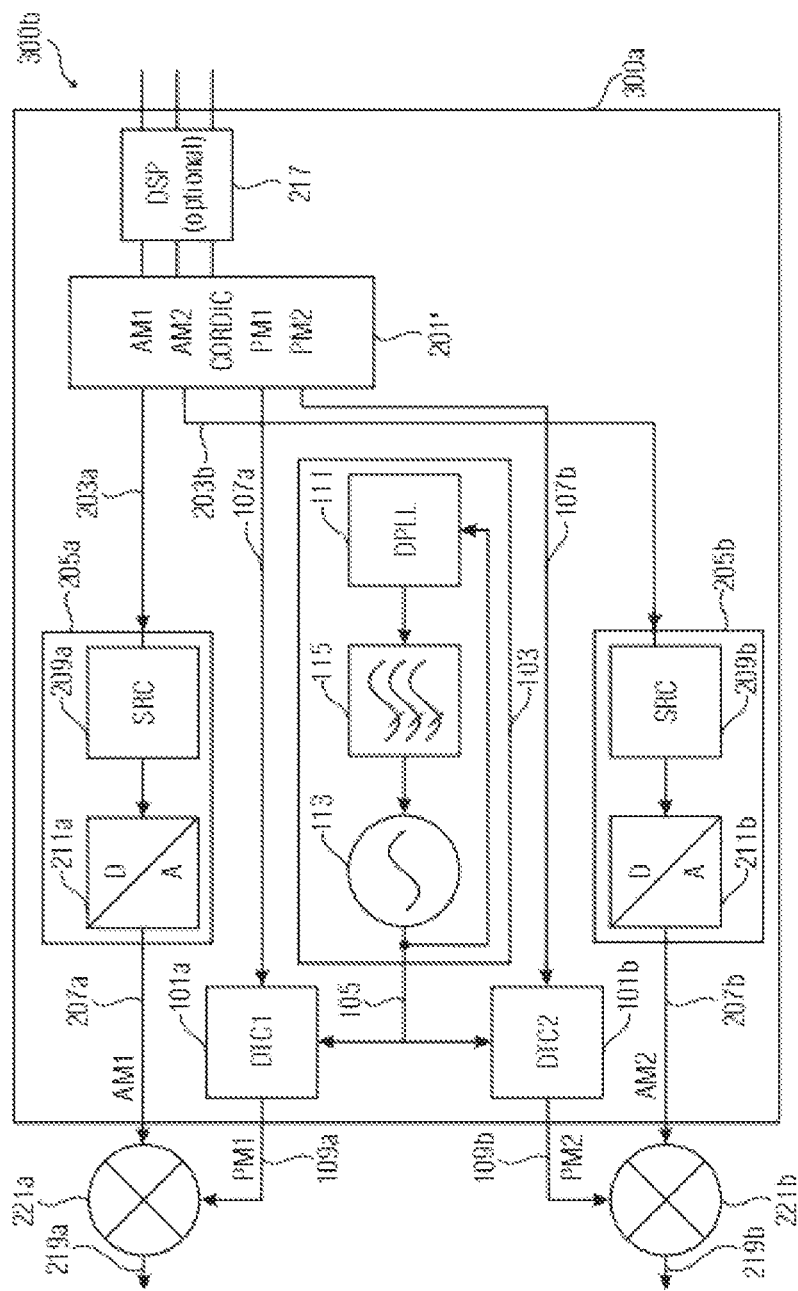
FIG. 3b shows a block diagram of a polar modulator according to a further embodiment of the present invention.

FIG. 3b shows, using a polar modulator 300b, how the first amplitude-modulated signal 207a can be combined with the first delayed HF signal 109a, in order to obtain a first transmission signal 219a, and how the second amplitude-modulated signal 207b can be combined with the second delayed HF signal 109b in order to obtain a second transmission signal 219b.

The polar modulator 300b also has a first mixer 221a and a second mixer 221b. The first mixer 221a is designed to mix the first amplitude-modulated signal 207a with the first delayed HF signal 109a in order to obtain the first transmission signal 219a as the result of the mixing. The second mixer 221b is designed to mix the second amplitude-modulated signal 207b with the second delayed HF signal 109b in order to obtain the second transmission signal 219b as the result of the mixing.

The polar modulator shown in FIG. 3b is therefore based on the small-signal polar modulation principle.

According to further embodiments, however, it is also possible to replace the two mixers 221a, 221b with amplifiers (for example, the amplifier 225 in FIG. 2c) such that the polar modulator 300b is then based on the large signal polar modulation principle.

In the embodiments described in FIGS. 2a-3c, a phase of the generated, delayed HF signals 109, 109a, 109b was adjusted in each case based only on the digital signals 107a, 107b, and therefore only based on the delay of the HF signal 105 generated by the digital-to-time converter 101a, 101b.

As explained above, it is also possible, however, according to several embodiments, to adjust the phase of the delayed HF signal 109, 109a, 109b by means of the phase-locked loop. This will be explained below with reference to the embodiments shown in FIGS. 4a-4d.

Figure 4A:
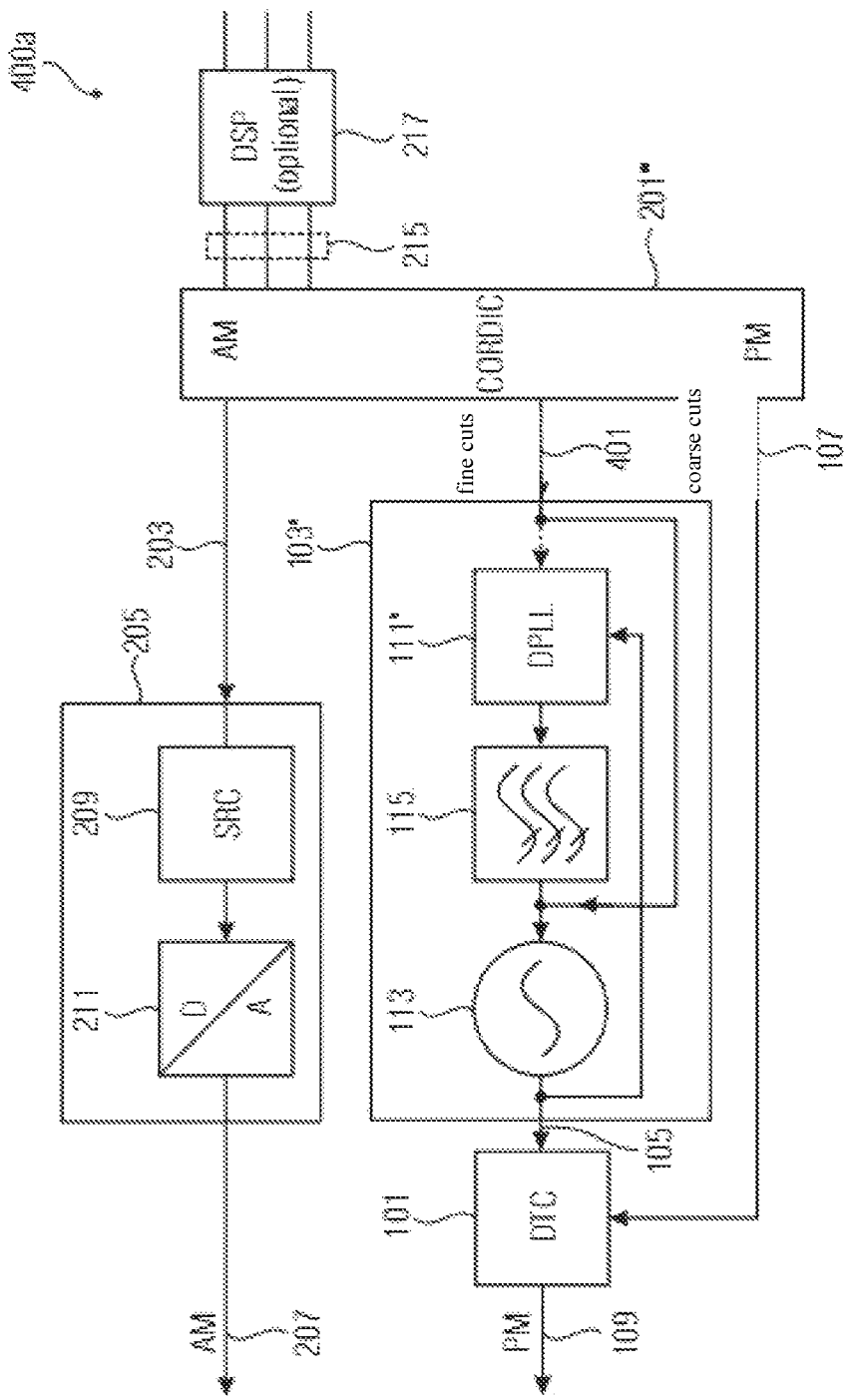
FIG. 4a shows a block diagram of a circuit according to a further embodiment of the present invention.

FIG. 4a shows a block diagram of a circuit 400a according to a further embodiment of the present invention.

The circuit 400a differs from the circuit 200a shown in FIG. 2a in that it has a slightly altered oscillator arrangement 103' and another polar coordinate provider 201".

While in the embodiments shown in FIGS. 2a-3b, the polar coordinate providers each provide the phase signals which are identical to the digital signals 107, 107a, 107b, and completely determine a phase and/or phase modification of the delayed HF signals 109, 109a, 109b, the polar coordinate provider 201" is designed to provide the first digital signal 107 and an additional digital signal 401, which together form the phase signal, the same describing a phase or a phase modification of the delayed HF signal 109. In other words, the polar coordinate provider 201" is designed to provide a phase signal which includes both the first digital signal 107 and also the additional digital signal 401, and determines a phase and/or a phase modification of the delayed HF signal 109 (completely). As such, by way of example, the first digital signal 107 can determine a first fraction of the phase and/or phase modification of the delayed HF signal 109, and the additional digital signal 401 can determine a second fraction of the phase and/or the phase modification of the delayed HF signal 109. The two fractions together therefore describe the entire phase and/or phase modification of the delayed HF signal 109.

As in the other embodiments above, the polar coordinate provider 201" provides the digital signal 107 to the digital-to-time converter 101. The digital-to-time converter 101 is designed to chronologically delay the HF signal 105 based on the digital signal 107.

In addition, in contrast to the embodiments described in FIGS. 2a-3b, the oscillator arrangement 103' is designed to vary a phase of the HF signal 105 based on the additional digital signal 401. The polar coordinate provider 201" is therefore designed to provide the additional digital signal 401 to the oscillator arrangement 103'. The oscillator arrangement 103' in this case can be designed to directly provide the additional digital signal 401 to the oscillator 113 (for example, via a built-in input of the oscillator 113) or together with the adjusting signal 119 of the loop filter 115 to a shared input of the oscillator 113.

In addition, the oscillator arrangement 103' can also be designed to provide the additional digital signal 401 (in addition to the oscillator 113) to a phase-locked loop 111' of the oscillator arrangement 103'.

The phase-locked loop 111' of the oscillator arrangement 103' can then vary the phase of the HF signal 105, in combination with the oscillator 113 and the loop filter 115, and according to the received additional digital signal 401.

The phase and/or phase modification of the delayed HF signal 109 is therefore based on a phase shift occurring in the oscillator arrangement 103' of the HF signal 105 and on a delay of the HF signal 105 by the digital-to-time converter 101.

In the case of the circuit 400a in FIG. 4a, the phase and/or a phase modification of the delayed HF signal 109 is based on a combination of a digital-to-time conversion and a modulation by the phase-locked loop 111'.

By way of example, this concept enables a configuration wherein large phase modulations (for example, encoded in the digital signal 107) are modulated by means of the digitalto-time converter 101, while small phase modulations (for example, encoded in the additional digital signal 401) are modulated by the oscillator arrangement 103'. In addition, it is also possible to divide a phase modification—as described above—into a first fraction and a second fraction, wherein the first fraction can be encoded in the digital signal 107, and the second fraction can be encoded in the additional digital signal 401.

As such, this phase modification can be divided, for example, in the case of a phase modification of 92°, into a first fraction of 90° and second fraction of 2°. In this case, the oscillator arrangement 103' can be designed to vary the phase of the HF signal 105 in such a manner that the same has undergone a phase modification of 2° as soon as it leaves the oscillator arrangement 103'. The remaining 90° phase modification can then be modulated by means of the digital-to-time converter 101, such that the resulting delayed HF signal 109 has undergone a phase modification of 92°.

In other words, the first fraction of the phase modification can be larger than the second fraction of the phase modification, and a sum of the first fraction and the second fraction can produce the phase modification.

According to further embodiments, however, it is also possible that the first fraction of the phase modification is larger than the second fraction of the phase modification, and a sum of the first fraction and of the second fraction results in the phase modification.

This has the advantage that it is particularly possible to carry out small phase modifications by means of the phase-locked loop 111', while large phase modifications can be carried out by means of the digital-to-time converter 101. It is particularly possible to realize smaller phase modifications in a simple and precise manner with the phase-locked loop 111', whereas the phase-locked loop 111' would otherwise reach its limits with large phase modifications. This is circumvented in that the digital-to-time converter 101 is used for large phase modifications.

The generation of the amplitude-modulated signal 207 can take place by means of the digital-to-analog converter arrangements 205, as in the embodiments described above. For this reason, no further explications are given for this digital-to-analog converter arrangement 205.

The circuit 400a can be used in polar modulators according to the embodiments of the present invention, for example.

Figure 4B:
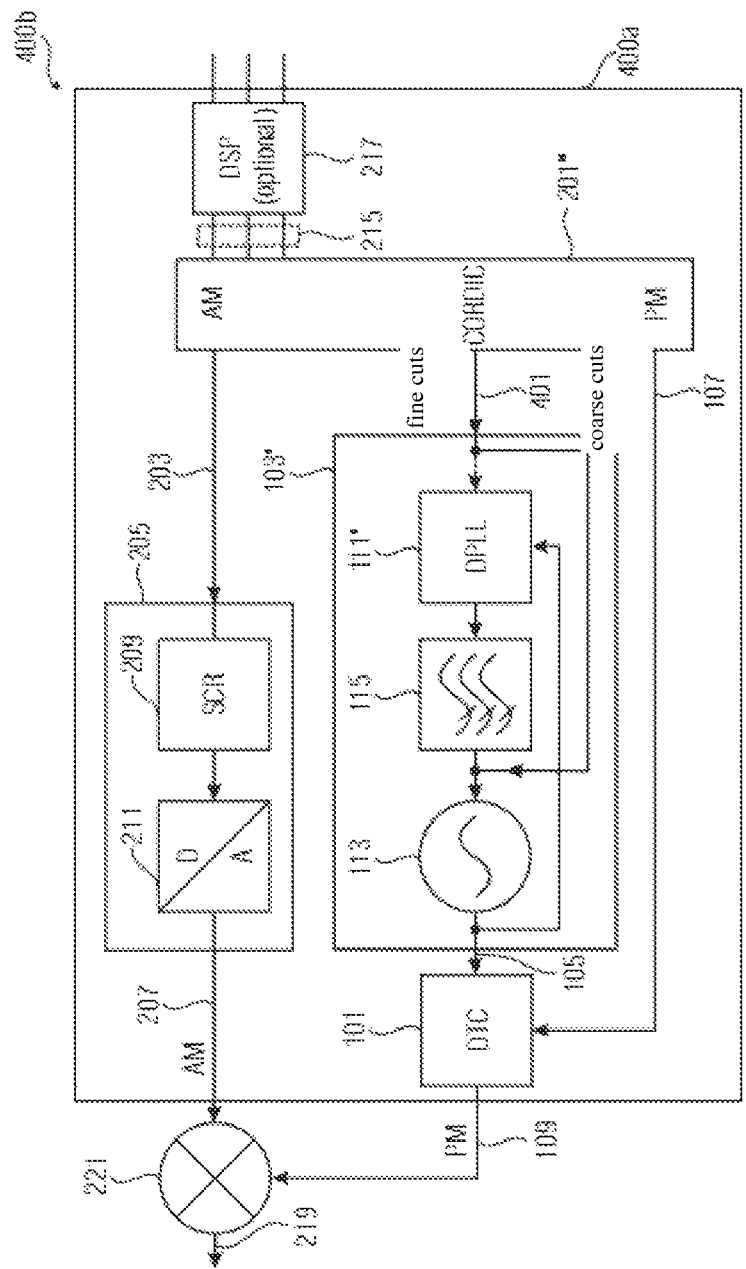
FIG. 4b shows a block diagram of a polar modulator according to a further embodiment of the present invention.

FIG. 4b shows a polar modulator 400b according to a further embodiment of the present invention.

The polar modulator 400b has a mixer 221 which is designed to mix the amplitude-modulated signal 207 provided by the circuit 400a and the delayed HF signal 109 provided by the circuit 400a in order to obtain a transmission signal 219 as the result of this mixing.

The polar modulator shown in FIG. 4b is a modulator based on the small-signal polar modulation principle.

According to further embodiments, it is of course also possible to replace the mixer 221 with an amplifier (such as the amplifier 225 according to FIG. 2c) in order to obtain a polar modulator according to the large signal polar modulation principle.

According to further embodiments, it is also possible to expand the circuit 400 shown in FIG. 4a to such a degree that it is possible to generate two different transmission signals despite the use of a common synthesizer.

Such a concept is described below with reference to FIG. 4c.

Figure 4C:
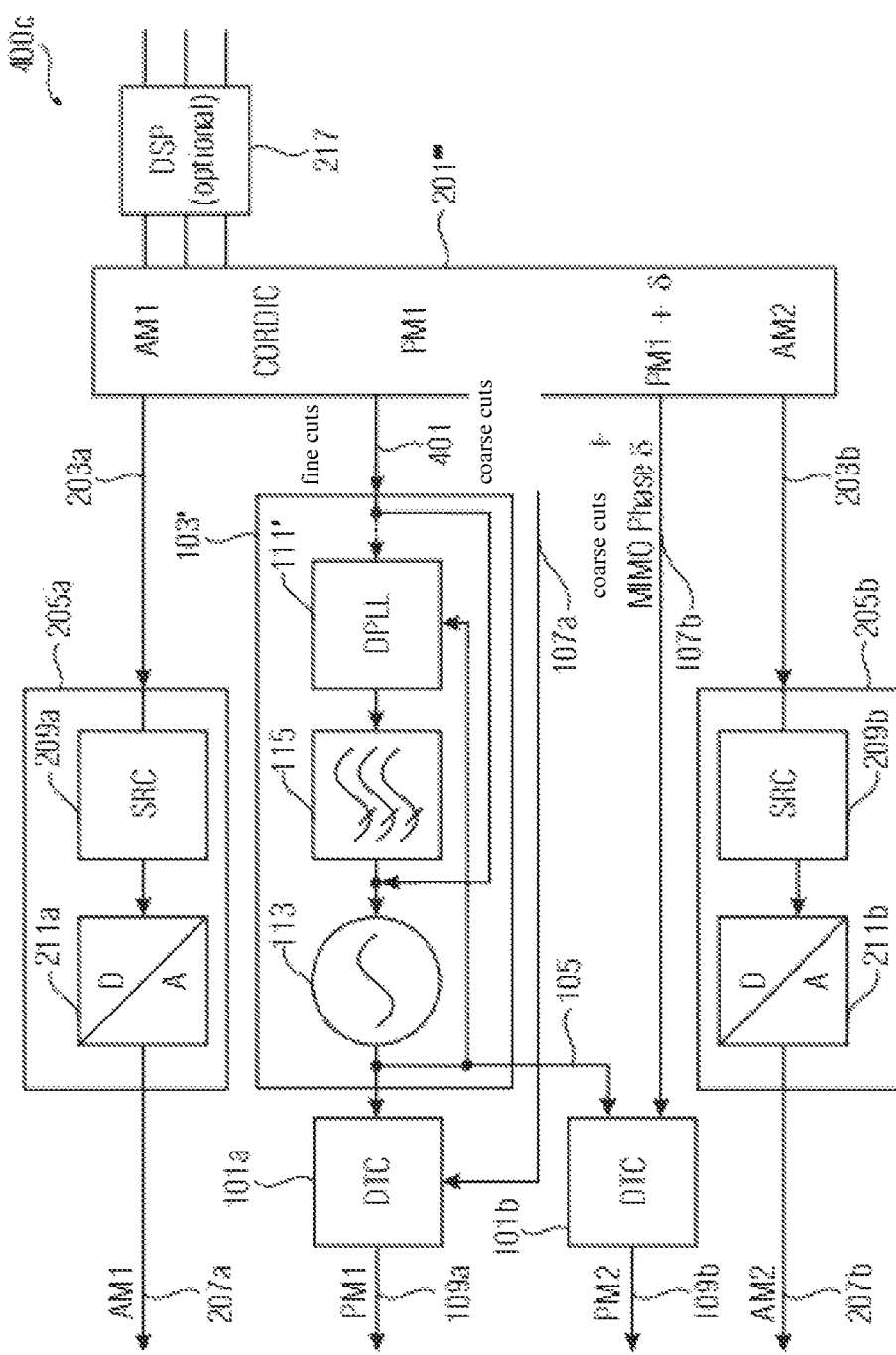
FIG. 4c shows a block diagram of a circuit according to a further embodiment of the present invention.

FIG. 4c shows a block diagram of a circuit 400c according to a further embodiment of the present invention.

This circuit 400c differs from the circuit 300a in that the oscillator arrangement 103', as described earlier with reference to FIG. 4a, is used in place of the oscillator arrangement 103, which generates the HF signal 105 independently of the digital signals 107a, 107b. In addition, a polar coordinate provider 201''' of the circuit 400c differs from the polar coordinate provider 201' of the circuit 300a in that the polar coordinate provider 201''' is further designed to provide the additional digital signal 401 to the oscillator arrangement 103'.

The polar coordinate provider 201'''provides the additional digital signal 401 in such a manner that the same determines both a second fraction of a phase and/or phase modification of the first delayed HF signal 109a and a second fraction of a phase and/or phase modification of the second delayed HF signal 109b. This second fraction of the phases and/or phase modifications of the delayed HF signals 109a, 109b are therefore identical.

The polar coordinate provider 201''' encodes phase differences between the two delayed HF signals 109a, 109b into the two digital signals 107a, 107b, which each determine a first fraction of the phase and/or a phase modification of the delayed HF signals 109a, 109b.

In other words, the polar coordinate provider 201''' provides a first phase signal which describes a phase of the first delayed HF signal 109a. The first phase signal in this case comprises the first digital signal 107a and the additional digital signal 401. The first digital signal 107a in this case determines a first fraction of the phase and/or a phase modification of the first delayed HF signal 109a, and the additional digital signal 401 determines a second fraction of the phase and/or a phase modification of the first delayed HF signal 109a.

In addition, the polar coordinate provider 201''' provides a second phase signal which describes the phase and/or a phase modification of the second delayed HF signal 109b. The second phase signal comprises the second digital signal 107b and the additional digital signal 401. The second digital signal 107b determines a first fraction of the phase and/or a phase modification of the second HF signal 109b, and the additional digital signal 401 determines a second fraction of the phase and/or a phase modification of the second delayed HF signal 109b.

As described above, the second fractions of the phase and/or phase modifications of the delayed HF signals 109a, 109b are the same.

A phase difference between the first delayed HF signal 109a and the second delayed HF signal 109b is therefore based on a difference between the first digital signal 107a and the second digital signal 107b.

As shown in FIG. 4c, the polar coordinate provider 201''' can shift the phase of the second delayed HF signal 109b by a value σ (for example, a MIMO phase) to the phase of the first delayed HF signal 109a. This phase shift between the two delayed HF signals 109a, 109b can be held constant for a prespecified period of time (for example, for a predetermined number of symbols which are encoded in transmission signals which are based on the delayed HF signals 109a, 109b).

As symbolically shown in FIG. 4c, the circuit 400c also comprises the first analog to digital converter 205a and the second analog to digital converter 205b. The circuit 400c can also be designed for the purpose of providing the amplitude-modulated signals 207a, 207b independently of each other (meaning as different from each other).

According to several embodiments of the present invention, the polar coordinate provider 201''' can be designed for the purpose of providing the first digital amplitude signal 203a and the second digital amplitude signal 203b in such a manner that the two are identical. In other words, the circuit 400c can be designed to provide the first amplitude-modulated signal 207a and the second amplitude-modulated signal 207b in such a manner that the two are identical.

The circuit 400c shown in FIG. 4c can be used in polar modulators according to embodiments of the present invention, for example.

Figure 4D:
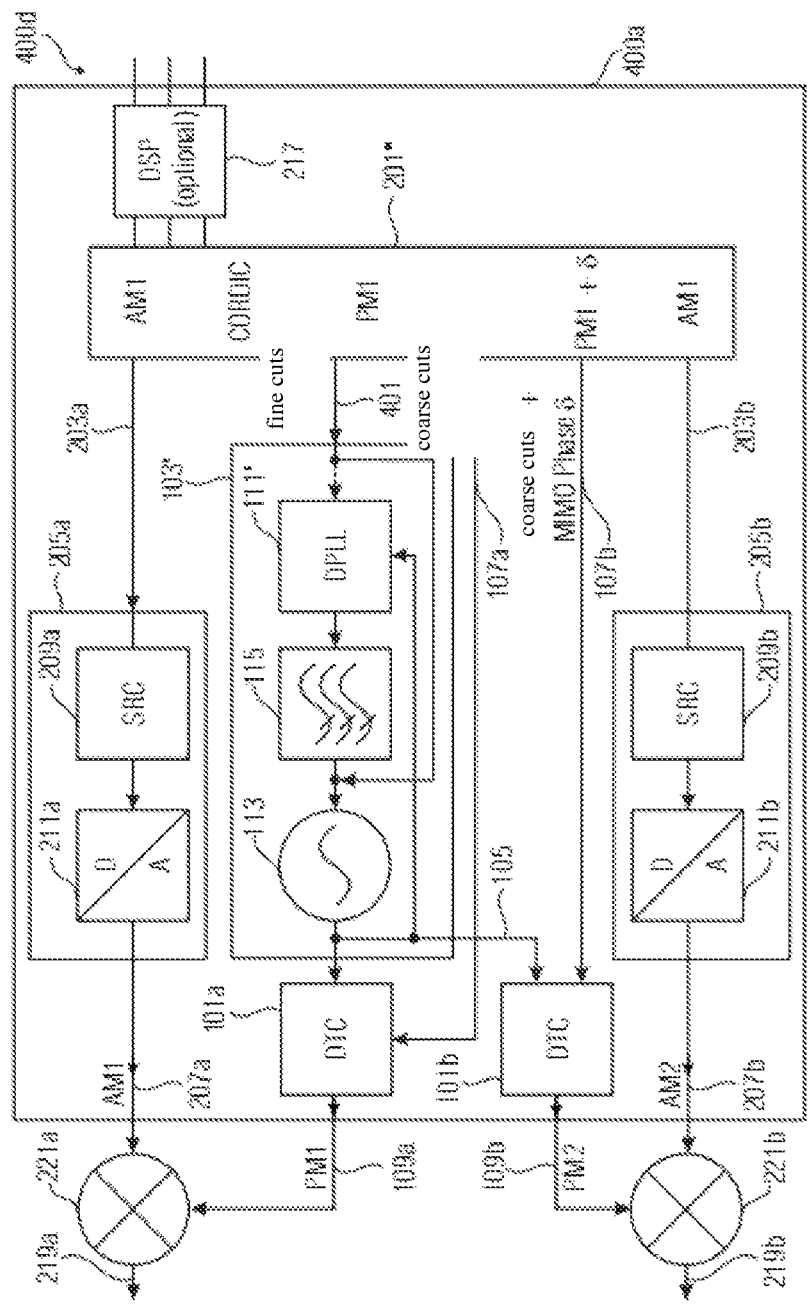
FIG. 4d shows a block diagram of a polar modulator according to a further embodiment of the present invention.

FIG. 4d shows a block diagram of a polar modulator 400d according to a further embodiment of the present invention.

The polar modulator 400d has the circuit 400c, and a first mixer 221a and a second mixer 221b.

The first mixer 221 is designed to mix the first amplitude-modulated signal 207a with the first delayed HF signal 109a to obtain a first transmission signal 219a as the result of this mixing.

In addition, the second mixer 221b is designed to mix the second amplitude-modulated signal 207b with the second delayed HG signal 109b in order to obtain a second transmission signal 219b as the result of this mixing.

The polar modulator 300d shown in FIG. 4d is based on the small-signal polar modulation principle.

According to further embodiments, as described above, the polar modulator 400d in this case as well can be adapted for the large signal polar modulation principle, particularly by replacing the mixer 221a, 221b with suitable amplifiers (such as the amplifier 225, for example).

The adjustment of the phase of the HF signal 105 in the oscillator arrangement 103' can take place by means of a capacitor matrix in the oscillator, for example. The oscillator arrangement 103' can also have an addition capacitor matrix, or an oscillator matrix also included can be used.

Of course, it is also possible in a polar modulator according to further embodiments of the present invention to generate two or more transmission signals which are entirely independent of each other, but which nevertheless have the possibility of being phase adjusted by means of the oscillator arrangements 103' and the digital-to-time converter 101. In these cases, the circuit 400a or the polar modulator 400b can simply be positioned in multiples lying next to each other, for example. In addition, it is also possible to create a MIMO system having two independent signals and different bands. In such a MIMO system and/or such a circuit, the HF circuit 400c or the polar modulator 400d can be included in multiple instances, for example.

Possible implementations of the polar coordinate provider 201" are shown below with reference to FIGS. 4e and 4f. Although in the following two figures the polar coordinate provider 201" is a component of the polar modulator 400b, this polar coordinate provider 202" can, according to further embodiments, also be used in further circuits according to embodiments of the present invention (for example, detached from the mixer 211).

FIG. 4e shows a further block diagram of the polar modulator 400b in FIG. 4b, with a possible implementation of the polar coordinate provider 201".

The polar coordinate provider 201" has a CORDIC module 411, a signal limiter 413, and a residual signal analyzer 415.

As in FIG. 4b, the polar coordinate provider 201" is designed to provide the additional digital signal 401 to the oscillator arrangement 103', and the first digital signal 107 to the digital-to-time converter 101, wherein the first digital signal 107 determines the first fraction of the phase and/or phase modification of the delayed HF signal 109, and the additional digital signal 401 determines the second fraction of the phase and/or phase modification of the delayed HF signal 109. The two fractions together therefore described the entire phase and/or phase modification of the delayed HF signal 109.

The CORDIC module 411 is designed to provide the signal limiter 413 and the residual signal analyzer 415 with the phase signal 417, which determines both the first digital signal 107 and also the second digital signal 401, and the phase and/or phase modification of the delayed HF signal 109 (completely).

The signal limiter 413 is designed to determine the additional digital signal 401 based on the phase signal 417, such that the additional digital signal 401 determines the second fraction of the phase and/or phase modification of the delayed HF signal 109. The residual signal analyzer 415 is designed to determine the first digital signal 107 based on the additional digital signal 401 and the phase signal 417, wherein said first digital signal [107] determines the first fraction of the phase and/or phase modification of the delayed HF signal 109.

As symbolically shown in FIG. 4e, the residual signal analyzer 415 can draw off the additional digital signal 401 from the phase signal 417 for this purpose, to determine the remaining residual (in the form of the first digital signal 107).

It is clear from this that the additional digital signal 401 and the first digital signal 107 are complementary to each other, and that the sum of the first digital signal 107 and the additional digital signal 401 is the same as the phase signal 417, the same incorporating the phase and/or phase modification of the delayed HF signal 109 completely.

As shown in FIG. 4e, the oscillator arrangement 103' can be designed to directly bring the additional digital signal 401 to the oscillator 113. According to further embodiments, however, it is also possible to also apply the signal fraction (the additional digital signal 401) to a second input of the phase-locked loop 111' as well (such as, for example, at a divider of the phase-locked loop 111'), rather than only applying the signal fraction of the PLL (in the form of the additional digital signal 401) to the oscillator 113 (for example, at the DCO), in order to obtain a modulation behavior of this signal fraction by means of the phase-locked loop 111' which is as independent from frequency as possible.

The term "limitation" in the context of the signal limiter 413 in this case can include any removal of signal fractions, including, for example, a restriction of the absolute signal range (saturation) and a restriction of the signal resolution (quantization), as well as a constraining of the spectral frequency range (high-pass filtering, low-pass filtering). Accordingly, coarser signal fractions are applied to the oscillator 113 (such as the DCO 113, for example), and finer fractions are applied to the digital-to-time converter 101, or just the opposite. As explained above, the two signal fractions (the first digital signal 107 and the additional digital signal 401) are always complementary to each other, however, such that the sum reproduces the total signal 417.

FIG. 4e also shows a first possible architecture wherein a signal limitation takes place by means of the signal limiter 413 to the oscillator 113, while the limitation residual 107 is relayed to the digital-to-time converter 101.

Figure 4F:
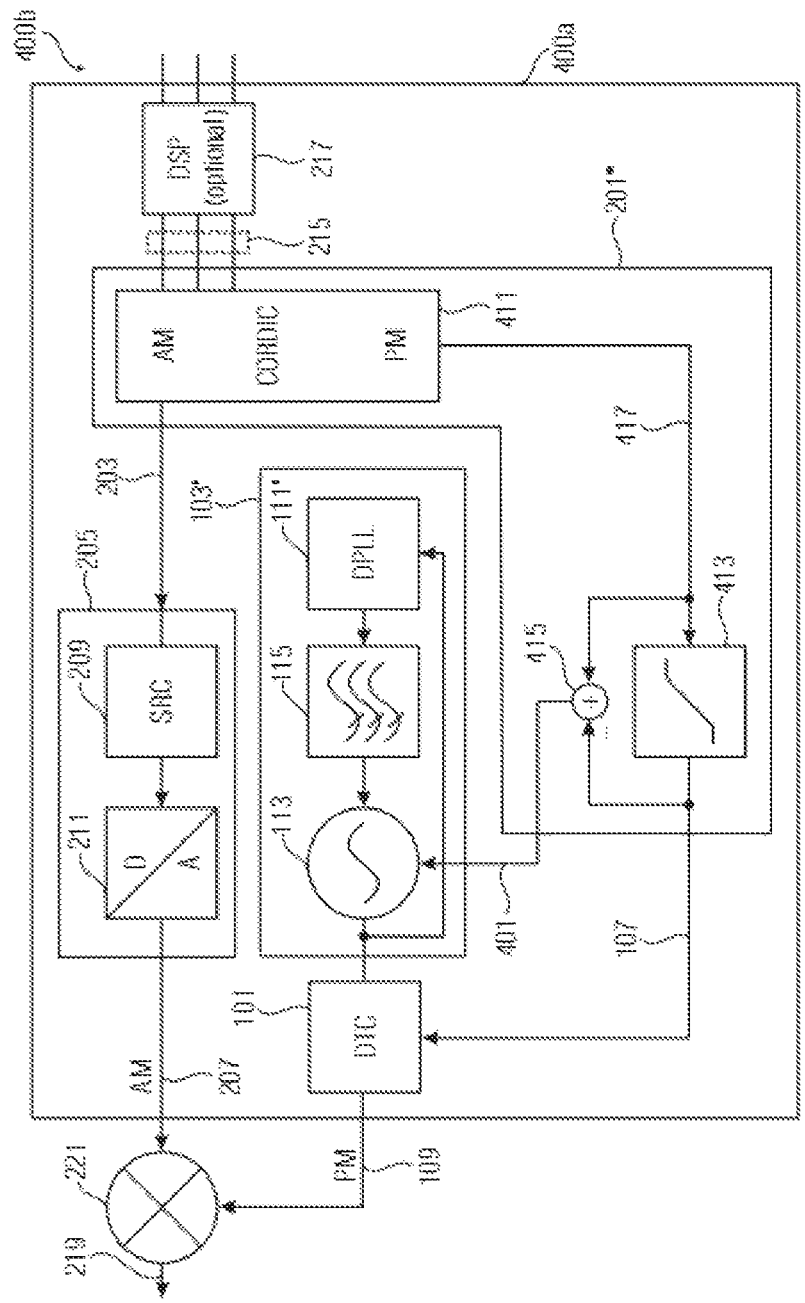
FIG. 4f shows a further block diagram of the polar modulator in FIG. 4b, with a further implementation possibility of the polar coordinate provider.

FIG. 4f further shows an additional possible architecture of the polar coordinate provider 201", wherein a signal limitation takes place in the path to the digital-to-time converter 101, while the limitation residual (the additional digital signal) 401 is relayed to the oscillator 113.

FIG. 4f also shows a further block diagram of the polar modulator 400b, having a further possible implementation of the polar coordinate provider 201". As in FIG. 4e the polar coordinate provider 201" has the CORDIC module 411, the signal limiter 413, and the signal residual analyzer 415.

The difference between the implementation of the polar coordinate provider 201" shown in FIG. 4e, and the implementation of the polar coordinate provider 201" shown in FIG. 4f is that in the implementation shown in FIG. 4f, the signal limiter 413 is connected between the CORDIC module 411 and the digital-to-time converter 401, and the residual signal analyzer 415 is connected between the CORDIC module 411 and the oscillator 113.

In the embodiment shown in FIG. 4f, the signal limiter 413 is therefore designed to limit the phase signal 417 generated by the CORDIC module 411, in order to obtain the first digital signal 107 based on this phase signal 417. The residual signal analyzer 415 is designed to draw off the first digital signal 107 from the phase signal 417 in order to obtain the additional digital signal 401 as the residual signal. As in the embodiment shown in FIG. 4e, the sum of the first digital signal 107 and the additional digital signal 401 therefore gives the phase signal 417, which completely determines the phase and/or the phase modification of the delayed HF signal 109.

Of course, it is also possible, as in the case of the embodiment shown in FIG. 4, that the additional digital signal 401 is also provided to the phase-locked loop 111' in order to enable a two-point modulation in this case.

In summary, the concept shown in FIGS. 4a to 4f enables the simplification of the design requirements for the digital-to-time converter 111 and the oscillator 113 with respect to resolution and the control range, by dividing the modulation to these two blocks (oscillator 113 and digital-to-time converter 111).

In summary, embodiments of the present invention combine a phase modulation with the RFDAC phase modulation architecture shown in FIG. 1, such that the existing limitations are overcome, and a new, simple transmission architecture is thereby created which has better modulation bandwidth configurability.

Embodiments of the present invention enable a direct phase modulation for a RFDAC, using digital-to-time converters.

A digital-to-time converter can also be termed a phase shifter.

Figure 5:
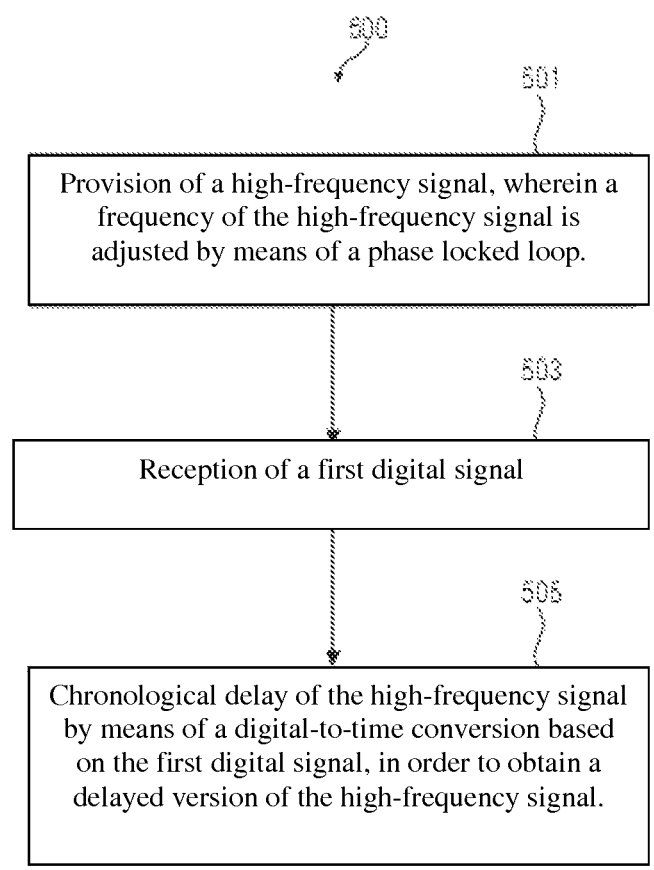
FIG. 5 shows a flow chart of a method according to a further embodiment of the present invention.

FIG. 5 shows a flow chart of a method 500 according to one embodiment of the present invention.

The method 500 has a step 501 of providing an HF signal, wherein a frequency of the HF signal is adjusted by means of a phase-locked loop.

In addition, the method 500 comprises a step 503 of receiving a digital signal.

In addition, the method 500 comprises a step 505 of chronologically delaying the HF signal by means of a digital-to-time conversion, based on the first digital signal, in order to obtain a delayed version of the HF signal.

The method 500 can be carried out, by way of example, by means of a circuit or a polar modulator according to one of the embodiments of the present invention.

In addition, it was recognized that crosstalk can occur, particularly in the implementation of an HF transceiver synthesizer together with an integration power amplifier.

Several embodiments of the present invention eliminate this problem of crosstalk by a suitable selection of the frequencies of the high-frequency signal 105, as provided by the oscillator arrangement 103, and of the frequency of the delayed version 109 of the high-frequency signal 105, as provided on the high-frequency output 101-5 of the digital-to-time converter 101.

According to several embodiments (such as that of the circuit 100 as shown in FIG. 1a), the first digital signal 107 and the high-frequency signal 105 are therefore selected in such a manner that the frequency of the high-frequency signal 105 is not a harmonic of the frequency of the delayed version 109 of the high-frequency signal 105.

As such, a configuration is enabled wherein no crosstalk occurs between the high-frequency signal 105 generated by the oscillator arrangement 103 and the delayed version of the high-frequency signal 105.

Figure 6:
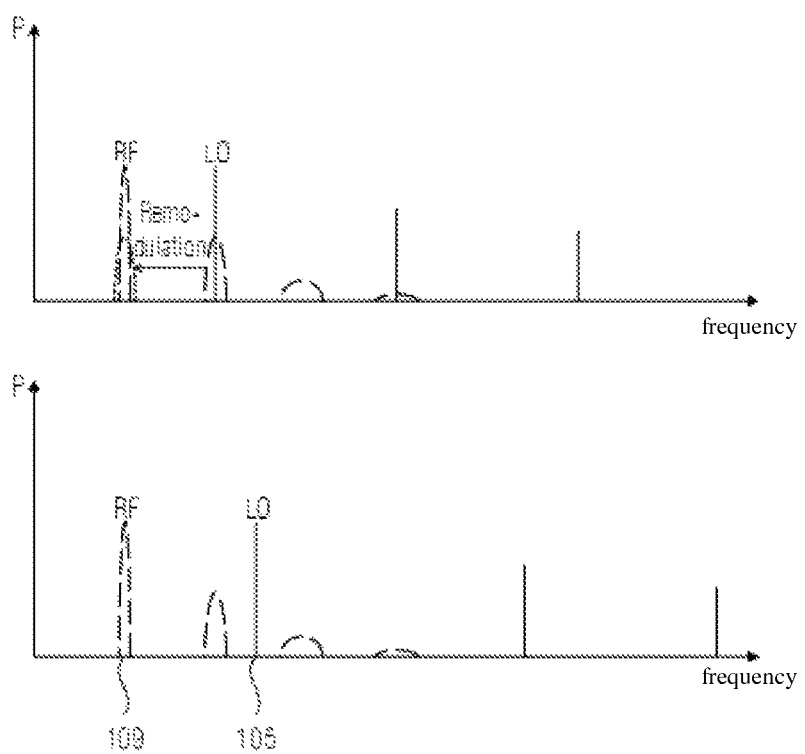
FIG. 6 shows diagrams comparing a conventional frequency plan to a frequency plan for embodiments of the present invention.

FIG. 6 shows a frequency plan, in a top diagram, of an architecture wherein a frequency of the LO signal is a harmonic of a frequency of a resulting RF signal. It is clear that a remodulation can occur, and therefore crosstalk can occur between the LO path (which carries the LO signal) and the RF path (which carries the RF signal).

In contrast, the lower diagram of FIG. 6 shows the frequency plan for a so-called "fractional synthesizer" according to one embodiment of the present invention, wherein the frequency of the high-frequency signal 105 (which is an LO signal, for example) is not a harmonic of the frequency of the delayed version 109 of the high-frequency signal 105. The frequency of the delayed version 109 of the high-frequency signal 105 can correspond to a carrier frequency of the RF signal in this case.

It is clear in the lower diagram in FIG. 6 that no remodulation and therefore no crosstalk occurs between the LO path and the RF path, as a result of the selection of the frequencies of the high-frequency signal 105 and the frequency of the delayed version 109 of the high-frequency signal 105. In other words, a crosstalk is eliminated between an RF output and the DCO synthesizer due to the non-harmonic frequency relationship between the high-frequency signal 105 and the delayed version 109 of the high-frequency signal 105.

Due to the fact that this crosstalk path is eliminated, the described architecture is particularly suited for high output powers, and therefore enables an integration of the power amplifier.

As described above, the digital-to-time converter 101 is designed to provide the delayed version 109 of the high-frequency signal 105 by dividing the frequency of the high-frequency signal 105 based on the digital signal 107. According to several embodiments, the digital-to-time converter 101 is therefore designed to divide the frequency of the high-frequency signal 105 by a division value which is based on the first digital signal 107, in order to obtain the delayed version 109 of the high-frequency signal 105. As described above, the frequency of the high-frequency signal 105 and the frequency of the delayed version 109 of the high-frequency signal 105 can selected in this case in such a manner that they are not harmonics of each other. According to several embodiments, this can be achieved in that a polar coordinate provider (for example, one of the polar coordinate providers 201, 201', 201", 201'") is designed to provide the first digital signal 107 in such a manner that the partial value based on the first digital signal 107 is not a whole number. In other words, the digital-to-time converter 101 can carry out a non-whole number frequency conversion. The combination of the digital-to-time converter-based transmission architecture with such a non-whole number frequency conversion, and an integration of the power amplifier, leads to a DCO synthesizer (digitally controlled oscillator) which oscillates to a non-harmonic (non-whole number multiple) fixed frequency, compared to a frequency of the RF output signal (for example, of the transmission signal 219, 223).

The selection, described above, of the frequency of the high-frequency signal 105 and the frequency of the delayed version 109 of the high-frequency signal 105 can be used in all embodiments described herein. For this reason, only two further embodiments are described below with reference to FIGS. 7a and 7b, wherein the above selection of the frequencies of the high-frequency signal 105 and the delayed version 109 of the high-frequency signal 105 is performed to select non-harmonics.

Figure 7A:
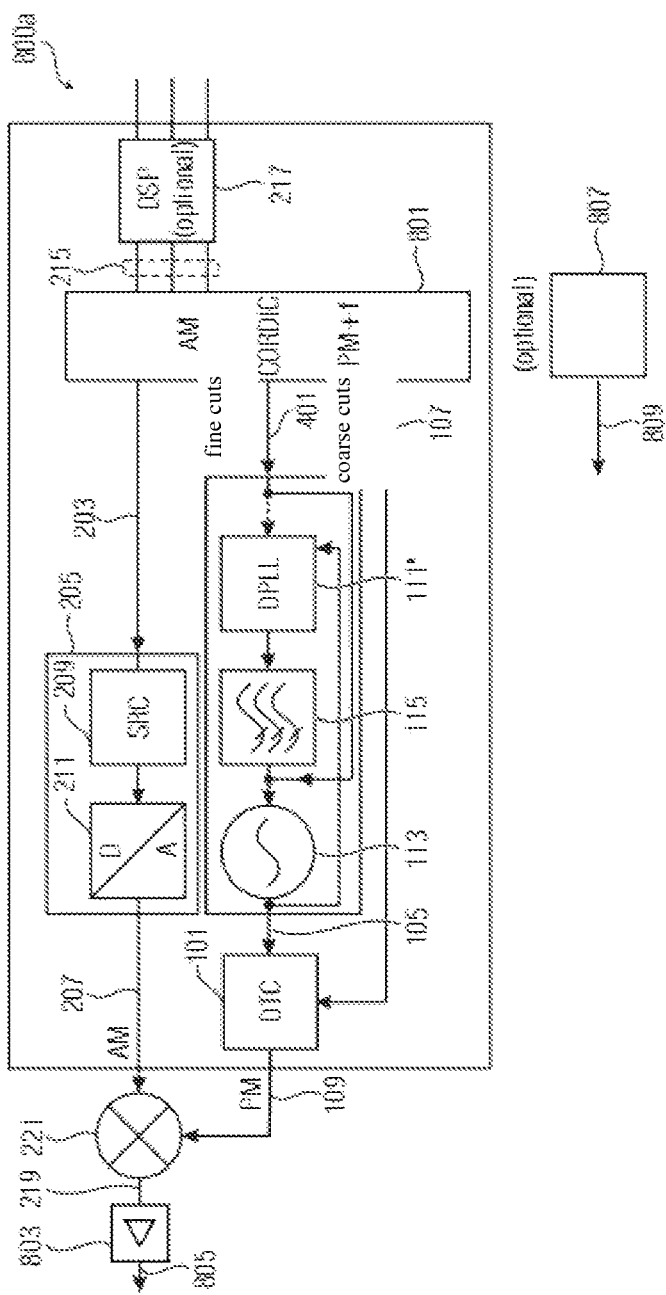
FIG. 7a shows a block diagram of a circuit according to a further embodiment of the present invention.

FIG. 7a shows a block diagram of a circuit 800a according to a further embodiment of the present invention. The circuit 800a is based on the circuit 400b shown in FIG. 4b, wherein the circuit 800a shown in FIG. 7a has a polar coordinate provider 801 which differs from the polar coordinate provider 201" shown in FIG. 4b in that the polar coordinate provider 801 is designed to provide the first digital signal 107 and the additional digital signal 401 in such a manner that the frequencies of the high-frequency signal 105 and the delayed version 109 of the high-frequency signal 105 are not harmonics (are not whole-number multiples) of each other.

Although in the embodiment of the polar coordinate provider 801 shown in FIG. 7a, both the first digital signal 107 and the additional digital signal 401 are provided, according to further embodiments it is also possible that the polar coordinate provider 801 only generates the first digital signal 107, and the oscillator arrangement 103' oscillates to a fixed frequency, meaning that a frequency of the high-frequency signal 105 cannot be adjusted, for example, but rather is fixed. The frequency of the high-frequency signal 105 in this case can be selected in such a manner that it is not a harmonic of another signal frequency which occurs in a system in which the circuit 800a is used. By way of example, the frequency of the high-frequency signal 105 can be selected in such a manner that it is not a harmonic of a carrier frequency prespecified by a mobile telecommunications standard.

In addition, the circuit 800a has a power amplifier 803 which is designed to receive the transmission signal 219 and to provide an amplified version 805 of the transmission signal 219. As described above, the selection of a non-harmonic frequency for the high-frequency signal 105 and the delayed version 109 of the high-frequency signal 105 enables an integration of the power amplifier 803 together with the oscillator arrangement 103' on one and the same chip, because the configuration prevents crosstalk between the high-frequency signal 105 and the delayed version 109 of the high-frequency signal 105 (and therefore between the high-frequency signal 105 or LO signal 105 and the transmission signal 219 or RF signal 219).

According to several embodiments, the power amplifier 803 is therefore arranged together with the oscillator arrangement 103' together on a shared chip (for example, on a shared semiconductor substrate).

As described above in the context of FIG. 4b, the polar coordinate provider 801 is designed to provide the first digital signal 107 to the digital-to-time converter 101, and to provide the additional digital signal 401 to the oscillator arrangement 103' according to a prespecified phase or phase modification of the delayed version 109 of the high-frequency signal 105, for the purpose of adjusting the frequency of the high-frequency signal 105.

In addition, the polar coordinate provider 801 shown in FIG. 7a is also designed to provide the further digital signal 401 for a prespecified phase or phase modification of the delayed version 109 of the high-frequency signal 105 in a first mode of the circuit 800a in such a manner that the high-frequency signal 105 takes on a first frequency, and to provide the additional digital signal 401 in a second mode of the circuit 800a in such a manner that the high-frequency signal 105 takes on a second frequency, wherein the first and the second frequency differ from each other and are not harmonics of each other.

As such, the configuration enables, for example, that—in the event that the circuit 800a is in the first mode, and a desired frequency of the transmission signal 219 is a harmonic of the current frequency of the high-frequency signal 105—then the circuit switches into the second mode in order to switch the frequency of the high-frequency signal 105, and particularly in such a manner that the frequency of the high-frequency signal 105 in the second mode is not a harmonic of the frequency of the high-frequency signal 105 in the first mode, and therefore is also not a harmonic of the desired frequency of the transmission signal 219.

According to further embodiments of the present invention, the polar coordinate provider 801 is also designed to provide the first digital signal 107 in the first mode and the second mode of the circuit 800a in such a manner that for the prespecified phase or phase modification of the delayed version of the high-frequency signal 105, a resulting frequency of the delayed version 109 of the high-frequency signal 105 in the first mode is the same as a resulting frequency of the delayed version 109 of the high-frequency signal 105 in the second mode. As such, the configuration enables, for example, that the frequency of the high-frequency signal 105 (by means of the modification of the additional digital signal 401) can be altered without changing the frequency of the transmission signal 219 at the same time. This can be practical, for example, in cases where an additional signal source (such as a further oscillator arrangement 807) is present together with the circuit 800a or, for example, as a component of the circuit 800a, which generates an oscillator signal 809 having a frequency which is a harmonic of the frequency of the high-frequency signal 105 in the first mode. In other words, the circuit 800a can have a further oscillator arrangement 807 which is designed to generate an oscillator signal 809 in an active state, which has a frequency which is a harmonic of the frequency of the high-frequency signal 105 in the first mode. The circuit 800a in this case can be designed to switch from the first mode to the second mode upon the activation of the further oscillator circuit 807 (such that the same is generating the oscillator signal 809), such that the frequency of the high-frequency signal 105 in the second mode and the frequency of the oscillator signal 809 are not harmonics of each other, but the frequency of the resulting transmission signal 219 remains unaffected by the switch.

The further oscillator arrangement 807 can be a component of at least one transmission or receiver circuit, for example. Such a transmission or receiver circuit can be designed to transmit and/or receive signals according to one of the following mobile telecommunications standards: FM radio, Bluetooth, GPS, WLAN, NFC, UMTS, GSM, LTE, Wi-Fi.

In summary, the architecture described in FIG. 7a enables an optimization of the frequency of the high-frequency signal 105, such as is generated by the oscillator arrangement 103' (or by the synthesizer 103') in different specific situations. By way of example, the frequency of the high-frequency signal 105 can be selected, as described above, in such a manner that crosstalk between different systems (which are implemented in a mobile telephone, for example, and/or are operated at the same time), is reduced. Accordingly, the frequency of the high-frequency signal 105 of the oscillator arrangement 103' (which can be a transmission synthesizer, for example) can be varied between different operating modes of the circuit 800a, and therefore also between different operating modes of a mobile telephone in which the circuit 800a is used.

Figure 7B:
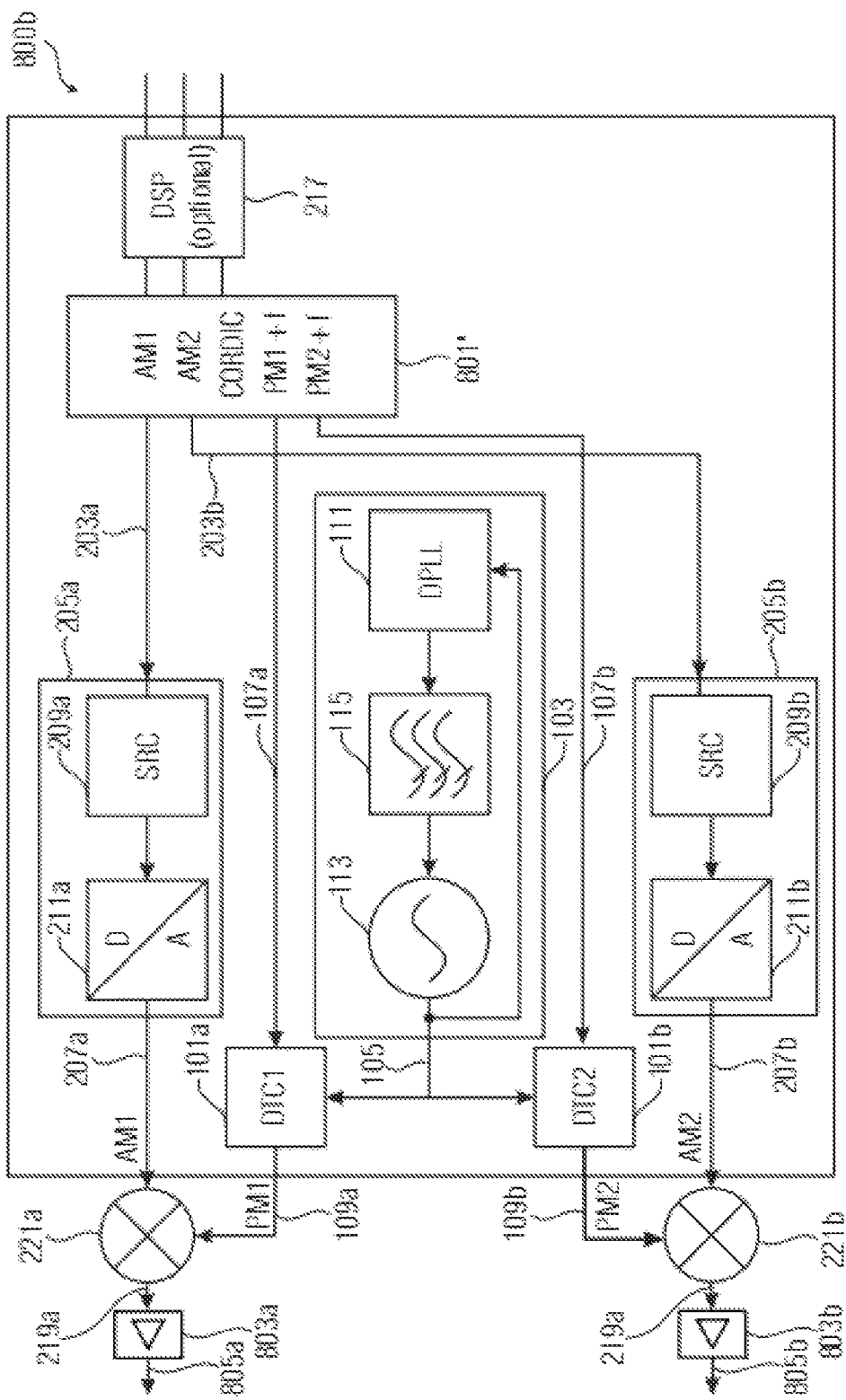
FIG. 7b shows a block diagram of a circuit according to a further embodiment of the present invention.

In addition, the described concept can also be expanded for transmission architectures which have multiple transmission paths (such as carrier wave aggregation, for example) which are defined in the mobile radio standards for 3G, 4G, and Wi-Fi, for example. FIG. 7b accordingly shows a base architecture for multiple different transmission paths.

The circuit 800b shown in FIG. 7b expands the circuit 800a shown in FIG. 7a to such an extent that the circuit 800b is designed to provide the two transmission signals 219a and 219b, and therefore also two amplified versions 805a, 805b of the transmission signal 219a, 219b.

The circuit 800b shown in FIG. 7b is based on the circuit 300b shown in FIG. 3b. A polar coordinate provider 801' of the circuit 800b expands the polar coordinate provider 201' shown in FIG. 3b in that the polar coordinate provider 801' is designed to provide the two digital signals 107a, 107b in such a manner that the frequency of the high-frequency signal 105 is not a harmonic of a frequency of the first delayed version 109a of the high-frequency signal 105, and is also not a harmonic of a frequency of the second delayed version 109b of the high-frequency signal 105.

Accordingly, the frequency of the high-frequency signal 105 and the frequency of the first transmission signal 219a are also not harmonics of each other, and also the frequency of the high-frequency signal 105 and the frequency of the second transmission signal 219b are not harmonics of each other.

In addition, the circuit 800b shown in FIG. 3b has a first power amplifier 803a and a second power amplifier 803b. The first power amplifier 803a is designed to receive and amplify the first transmission signal 219a in order to obtain a first amplified transmission signal 805a. The second power amplifier 803b is designed to receive and amplify the second transmission signal 219b in order to obtain a second amplified transmission signal 805b.

Although the polar coordinate provider 801' in the circuit 800b shown in FIG. 7b does not provide the additional digital signal 401—the same shown in FIG. 4d, among others—to the oscillator arrangement 103, according to further embodiments of the polar coordinate provider 801', the configuration can of course be designed to provide this additional digital signal 401 of the oscillator arrangement 103 for the purpose of adjusting the frequency of the high-frequency signal 105.

As in the circuit 800a shown in FIG. 7a, the selection of the frequencies of the high-frequency signal 105 and the delayed versions 109a, 109b of the high-frequency signal 105 enables the power amplifiers 803a, 803b to be implemented together with the oscillator arrangement 103 on one and the same chip (for example, even on one and the same substrate) of the circuit 800b.

Although the described principle of selecting the frequency of the high-frequency signal 105 as a non-harmonic of the frequencies of the resulting transmission signals 219, 219a, 219b was only described in the context of the embodiments shown in FIGS. 7a and 7b, this principle can also of course be applied in the other embodiments of the present invention described herein and is not restricted to application in the embodiments described in detail in FIGS. 7a and 7b.

Although some aspects were described in the context of a device, it should be understood that these aspects also constitute a description of the corresponding method, such that a block or a component of a device can also be understood as a corresponding method step or as a feature of a method step. In an analogous manner, aspects which were described in the context of a method step or as a method step also constitute a description of a corresponding block or details or features of a corresponding device. Some or all of the method steps can be executed by a hardware device (or by utilizing a hardware device), such as a microprocessor, a programmable computer, or an electronic circuit, for example. In several embodiments, a few or more of the most important method steps can be executed by such a device.

According to particular implementation requirements, embodiments of the invention can be implemented in hardware or in software. The implementation can be carried out utilizing a digital storage medium, for example, a floppy disk, a DVD, a Blu-ray disk, a CD, a ROM, a PROM, an EPROM, an EEPROM or a FLASH storage device, a hard disk, or another magnetic or optical storage device, on which electronically readable control signals are saved, which can or do work together with a programmable computer system in such a manner that the respective method is carried out. For this reason, the digital storage medium can be computer-readable.

Some of the embodiments according to the invention therefore comprise a data storage medium which has electronically readable control signals which are able to work together with a programmable computer system in such a manner that one of the methods described herein can be carried out.

In general, embodiments of the present invention can be implemented as computer program products having a program code, wherein the program code is able to carry out one of the methods when the computer program product is run on a computer.

The program code can be saved on a machine-readable storage medium, for example.

Other embodiments comprise the computer program for carrying out one of the methods described herein, wherein the computer program is saved on a machine-readable storage medium.

In other words, one embodiment of the method according to the invention is therefore a computer program which has a program code for carrying out one of the methods described herein when the computer program is run on a computer.

A further embodiment of the method according to the invention is therefore a data storage medium (or a digital storage medium or a computer-readable medium) on which the computer program is written for carrying out one of the methods described herein.

A further embodiment of the method according to the invention is therefore a data stream or a sequence of signals which the computer program generates for the purpose of carrying out one of the methods described herein. The data stream or the sequence of signals can be configured, by way of example, as to be transferred via a data communication connection, for example, via the Internet.

A further embodiment comprises a processing device, for example, a computer or a programmable logic component, which is configured or modified to carry out the method described herein.

A further embodiment comprises a computer on which the computer program is installed for the purpose of carrying out one of the methods described herein.

A further embodiment according to the invention comprises a device or a system which is designed to transmit a computer program for carrying out at least one of the methods described herein to a receiver. The transmission can occur electronically or optically, for example. The receiver can be a computer, a mobile device, a storage medium, or a similar device, for example. The device or the system can comprise a data server for transmitting the computer program to the receiver, for example.

In some embodiments, a programmable logic component (for example, a field-programmable gate array, an FPGA) can be used for the purpose of carrying out some or all functionalities of the methods described herein. In some embodiments, a field-programmable gate array can work together with a microprocessor to carry out one of the methods described herein. In general, the methods are carried out by any arbitrary hardware device in several embodiments. These can be a universally implementable hardware device, such as a computer processor (CPU), or a hardware device which is specific for the method, such as an ASIC, for example.

The embodiments described above merely constitute a representation of the principles of the present invention. It should be understood that modifications and variations of the arrangements and details described herein will be illuminated by other persons skilled in the art. Therefore, it is intended that the invention is only restricted by the scope of protection of the claims below, and not by the specific details which have be presented here with reference to the description and the explanation of the embodiments.

The invention claimed is:

1. A circuit, comprising:
   a digital-to-time converter comprising a high-frequency input configured to receive a high-frequency signal, a digital input configured to receive a first digital signal, and a high-frequency output configured to provide a chronologically delayed version of the high-frequency signal; and
   an oscillator arrangement configured to provide the high-frequency signal having a phase-locked loop configured to provide a frequency of the high-frequency signal; and
   wherein the digital-to-time converter is configured to chronologically delay the received high-frequency signal based on the first digital signal received at its digital input.

2. The circuit according to claim 1, wherein the oscillator arrangement is further configured to vary a phase of the high-frequency signal based on an additional digital signal.

3. The circuit according to claim 1, further comprising:
   a polar coordinate provider configured to provide a first phase signal that determines a phase modification or a phase of the delayed version of the high-frequency signal; and
   wherein the first phase signal includes the first digital signal or is the first digital signal.

4. The circuit according to claim 3:
   wherein the polar coordinate provider is configured to provide the first phase signal in such a manner that it includes the first digital signal and an additional digital signal;
   wherein the polar coordinate provider is further configured to provide the digital-to-time converter with the first digital signal, and to provide the additional digital signal to the oscillator arrangement; and
   wherein the polar coordinate provider is further configured to provide the first digital signal and the additional digital signal in such a manner that the first digital signal determines a first fraction of the phase or the phase modification of the delayed version of the high-frequency signal, and the additional digital signal determines a second fraction of the phase or the phase modification of the delayed version of the high-frequency signal, such that the first digital signal and the additional digital signal together completely determine the phase or the phase modification of the delayed version of the high-frequency signal.

5. The circuit according to claim 4, wherein the polar coordinate provider is further configured in such a manner that the first digital signal and the additional digital signal are provided in such a manner that the first fraction of the phase or the phase modification of the delayed version of the high-frequency signal is larger than the second fraction of the phase or the phase modification of the delayed version of the high-frequency signal.

6. The circuit according to claim 1, further comprising a digital-to-analog converter arrangement which is configured to provide an amplitude-modulated signal based on a received digital amplitude signal.

7. The circuit according to claim 6, further comprising an amplifier configured to amplify the delayed version of the high-frequency signal based on the amplitude-modulated signal.

8. The circuit according to claim 6, further comprising a mixer configured to mix the amplitude-modulated signal and the delayed version of the high-frequency signal.

9. The circuit according to claim 1, further comprising:
   an additional digital-to-time converter having a high-frequency input configured to receive the high-frequency signal, a digital input configured to receive a second digital signal, and a high-frequency output configured to provide a further chronologically delayed version of the high-frequency signal; and
   wherein the additional digital-to-time converter is configured to chronologically delay the received high-frequency signal based on the second digital signal received at its digital input.

10. The circuit according to claim 9, further comprising:
    a polar coordinate provider configured to provide a first phase signal that includes the first digital signal and an additional digital signal, and to provide a second phase signal that includes the second digital signal and the additional digital signal;
    wherein the first phase signal determines a phase or a phase modification of the delayed version of the high-frequency signal, and the second phase signal determines a phase or a phase modification of the additional delayed version of the high-frequency signal;
    wherein the first digital signal determines a first fraction of the phase or the phase modification of the delayed version of the high-frequency signal, and the additional digital signal determines a second fraction of the phase or the phase modification of the delayed version of the high-frequency signal; and
    wherein the second digital signal determines a first fraction of the phase or the phase modification of the additional delayed version of the high-frequency signal, and the additional digital signal further determines a second fraction of the phase or the phase modification of the additional delayed version of the high-frequency signal, in such a manner that the second fraction of the phase or the phase modification of the additional delayed version of the high-frequency signal is the same as the second fraction of the phase or the phase modification of the delayed version of the high-frequency signal.

11. The circuit according to claim 10:
    wherein the polar coordinate provider is configured to provide the digital-to-time converter with the first digital signal, the oscillator arrangement with the additional digital signal, and the additional digital-to-time converter with the second digital signal; and
    wherein the oscillator arrangement is configured to vary a phase of the high-frequency signal based on the received additional digital signal.

12. The circuit according to claim 10, wherein the polar coordinate provider is configured to provide the first digital signal, the second digital signal, and the additional digital signal in such a manner that the first fraction of the phase or the phase modification of the delayed version of the high-frequency signal and the first fraction of the phase or the phase modification of the additional delayed version of the high-frequency signal are larger than the second fraction of the phase or the phase modification of the delayed version of the high-frequency signal and the second fraction of the phase or the phase modification of the additional delayed version of the high-frequency signal.

13. The circuit according to claim 10, wherein the polar coordinate provider is configured to provide the first digital signal and the second digital signal in such a manner that a difference between the phase of the delayed version of the high-frequency signal and the phase of the additional delayed version of the high-frequency signal is based on a difference between the first digital signal and the second digital signal.

14. The circuit according to claim 9, further comprising:
a polar coordinate provider configured to provide a first phase signal that determines a phase or a phase modification of the delayed version of the high-frequency signal, and to provide a second phase signal that determines a phase or a phase modification of the additional delayed version of the high-frequency signal;
wherein the first phase signal includes the first digital signal or is the first digital signal;
wherein the second phase signal includes the second digital signal or is the second digital signal;
wherein the polar coordinate provider is further configured to provide a first digital amplitude signal and a second digital amplitude signal.

15. The circuit according to claim 14, further comprising:
a first digital-to-analog converter arrangement configured to provide a first amplitude-modulated signal based on the first digital amplitude signal; and
a second digital-to-analog converter arrangement configured to provide a second amplitude-modulated signal based on the second digital amplitude signal.

16. The circuit according to claim 15, further comprising:
a first amplifier configured to amplify the delayed version of the high-frequency signal based on the first amplitude-modulated signal; and
a second amplifier configured to amplify the delayed version of the high-frequency signal based on the second amplitude-modulated signal.

17. The circuit according to claim 15, further comprising:
a first mixer configured to mix the first amplitude-modulated signal with the delayed version of the high-frequency signal; and
a second mixer configured to mix the second amplitude-modulated signal with the additional delayed version of the high-frequency signal.

18. The circuit according to one claim 1, further comprising:
a polar coordinate provider configured to provide the first digital signal in such a manner that same comprises a superposition of multiple payload data signals, of which one payload data signal can consist of a signal with a prespecified constant frequency.

19. The circuit according to claim 1, wherein the first digital signal and the high-frequency signal are selected in such a manner that the frequency of the high-frequency signal is not a harmonic of the frequency of the delayed version of the high-frequency signal.

20. The circuit according to claim 1:
wherein the digital-to-time converter is configured to divide down the frequency of the high-frequency signal to a divider value which is based on the first digital signal; and
wherein the circuit further comprises a polar coordinate provider which is configured to provide the first digital signal in such a manner that the divider value is not an integer number.

21. The circuit according to claim 1, further comprising:
a polar coordinate provider configured to provide the digital-to-time converter with the first digital signal and to provide an additional digital signal to the oscillator arrangement for the purpose of adjusting the frequency of the high-frequency signal, according to a prespecified phase or phase modification of the delayed version of the high-frequency signal;
wherein the polar coordinate provider is further configured to provide the additional digital signal for the prespecified phase or phase modification of the delayed version of the high-frequency signal in a first mode, in such a manner that the high-frequency signal takes on a first frequency, and to provide the additional digital signal in a second mode, in such a manner that the high-frequency signal takes on a second frequency, wherein the first and the second frequency are different from each other and are not harmonics of each other.

22. The circuit according to claim 21, wherein the polar coordinate provider is further configured to provide the first digital signal in the first mode and the second mode in such a manner that for the prespecified phase or phase modification of the delayed version of the high-frequency signal, a resulting frequency of the delayed version of the high-frequency signal in the first mode is the same as a resulting frequency of the delayed version of the high-frequency signal in the second mode.

23. A circuit arrangement, comprising:
a circuit, comprising:
a digital-to-time converter comprising a high-frequency input configured to receive a high-frequency signal, a digital input configured to receive a first digital signal, and a high-frequency output configured to provide a chronologically delayed version of the high-frequency signal; and
an oscillator arrangement configured to provide the high-frequency signal having a phase-locked loop configured to provide a frequency of the high-frequency signal;
wherein the digital-to-time converter is configured to chronologically delay the received high-frequency signal based on the first digital signal received at its digital input;
a polar coordinate provider configured to provide the digital-to-time converter with the first digital signal and to provide an additional digital signal to the oscillator arrangement for the purpose of adjusting the frequency of the high-frequency signal, according to a pre-specified phase or phase modification of the delayed version of the high-frequency signal;
wherein the polar coordinate provider is further configured to provide the additional digital signal for the pre-specified phase or phase modification of the delayed version of the high-frequency signal in a first mode, in such a manner that the high-frequency signal takes on a first frequency, and to provide the additional digital signal in a second mode, in such a manner that the high-frequency signal takes on a second frequency, wherein the first and the second frequency are different from each other and are not harmonics of each other; and
a further oscillator circuit configured to generate an oscillator signal in an active state, wherein the same comprises a frequency which is a harmonic of the first frequency of the high-frequency signal,
wherein the circuit is configured to switch from the first mode into the second mode upon the activation of the further oscillator circuit.

24. A device, comprising:
a baseband processor;
an antenna port; and
a circuit which is coupled to the baseband processor and the antenna port, wherein the circuit comprises:
- a digital-to-time converter comprising a high-frequency input configured to receive a high-frequency signal, a digital input configured to receive a first digital signal, and a high-frequency output configured to provide a chronologically delayed version of the high-frequency signal; and
- an oscillator arrangement configured to provide the high-frequency signal having a phase-locked loop configured to provide a frequency of the high-frequency signal; and
- wherein the digital-to-time converter is configured to chronologically delay the received high-frequency signal based on the first digital signal received at its digital input.

25. A method, comprising:
providing a high-frequency signal, wherein a frequency of the high-frequency signal is adjusted by means of a phase-locked loop;
receiving a first digital signal; and
chronologically delaying the high-frequency signal by means of a digital-to-time conversion based on the first digital signal, in order to obtain a delayed version of the high-frequency signal.

26. A computer program having a program code stored in a non-transitory storage medium, for executing a method when the program is executed on a computer, comprising:
providing a high-frequency signal, wherein a frequency of the high-frequency signal is adjusted by means of a phase-locked loop;
receiving a first digital signal; and
chronologically delaying the high-frequency signal by means of a digital-to-time conversion based on the first digital signal, in order to obtain a delayed version of the high-frequency signal.

* * * * *